United States Patent
Moriai et al.

(10) Patent No.: US 12,542,525 B2
(45) Date of Patent: Feb. 3, 2026

(54) NOTCH FILTER

(71) Applicant: TDK CORPORATION, Tokyo (JP)

(72) Inventors: Katsunari Moriai, Tokyo (JP); Shunsuke Ogura, Tokyo (JP); Takeshi Oyanagi, Tokyo (JP); Ryo Morita, Tokyo (JP); Yusuke Imai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 471 days.

(21) Appl. No.: 18/098,929

(22) Filed: Jan. 19, 2023

(65) Prior Publication Data

US 2023/0283253 A1   Sep. 7, 2023

(30) Foreign Application Priority Data

Jan. 31, 2022   (JP) ................. 2022-013497

(51) Int. Cl.
| | | |
|---|---|---|
| *H03H 7/06* | (2006.01) | |
| *H01C 7/10* | (2006.01) | |
| *H01C 7/102* | (2006.01) | |
| *H01C 7/12* | (2006.01) | |
| *H02H 9/04* | (2006.01) | |
| *H03H 7/01* | (2006.01) | |

(52) U.S. Cl.
CPC ............. *H03H 7/06* (2013.01); *H01C 7/1006* (2013.01); *H01C 7/102* (2013.01); *H03H 7/17* (2013.01); *H01C 7/12* (2013.01); *H02H 9/04* (2013.01); *H03H 2007/013* (2013.01)

(58) Field of Classification Search
CPC ........ H01C 7/1006; H01C 7/102; H01C 7/12; H03H 7/06; H03H 7/17
See application file for complete search history.

(56) References Cited

U.S. PATENT DOCUMENTS

| | | | | |
|---|---|---|---|---|
| 5,101,180 A | * | 3/1992 | Frey .................. | H04B 3/28 361/111 |
| 7,859,364 B2 | * | 12/2010 | Sakisaka ............ | H03H 7/1766 333/185 |
| 7,982,557 B2 | * | 7/2011 | Sakisaka ............ | H03H 7/0115 333/185 |
| 8,018,305 B2 | * | 9/2011 | Tomaki .............. | H01P 1/20327 333/203 |
| 10,957,959 B2 | * | 3/2021 | Ashida ............... | H01P 1/20381 |
| 11,870,413 B2 | * | 1/2024 | Li ....................... | H01Q 5/378 |

(Continued)

FOREIGN PATENT DOCUMENTS

| | | |
|---|---|---|
| JP | H07-115306 A | 5/1995 |
| JP | H09-186050 A | 7/1997 |

(Continued)

OTHER PUBLICATIONS

JP2001060838 machine translation (Year: 2001).*

(Continued)

*Primary Examiner* — Kyung S Lee
(74) *Attorney, Agent, or Firm* — Oliff PLC

(57) ABSTRACT

A notch filter 100 includes a varistor 1 that is connected between a signal line SL and a ground G. The varistor 1 has a capacitive component and outputs a signal with a second frequency different from a signal with a first frequency flowing in the signal line SL and a signal with the second frequency superimposed on the signal line SL to the ground G.

7 Claims, 18 Drawing Sheets

(56) References Cited

U.S. PATENT DOCUMENTS

2006/0114634 A1\* 6/2006 Terada .................... H03H 7/38
361/118
2006/0227473 A1 10/2006 Inoue et al.
2007/0188267 A1\* 8/2007 Togashi .................. H01G 4/35
29/25.42

FOREIGN PATENT DOCUMENTS

| JP | 2001060838 | \* | 3/2001 |
| JP | 2005-260137 A | | 9/2005 |
| JP | 2006-049532 A | | 2/2006 |
| JP | 2006156846 | \* | 6/2006 |
| JP | 2017-073257 A | | 4/2017 |

OTHER PUBLICATIONS

JP2006156846 machine translation (Year: 2006).\*
Jun. 17, 2025 Office Action issued in Japanese Patent Application No. 2022-013497.

\* cited by examiner

NOTCH FILTER

TECHNICAL FIELD

The present disclosure relates to a notch filter.

BACKGROUND

In electronic circuits and the like, an LC filter is provided in order to attenuate noise flowing in a signal line (for example, refer to Japanese Unexamined Patent Publication No. H9-186050).

SUMMARY

In electronic circuits and the like, in addition to the foregoing LC filter for noise attenuation, a protective element (varistor) is provided in order to protect a semiconductor element and the like from various kinds of surge (transient voltage) such as electrostatic discharge (ESD). For this reason, in electronic circuits, there is a need to mount an LC filter for noise attenuation and a protective element for surge protection. Here, when a product to be provided with an electronic circuit is miniaturized, a mounting area for components is limited. For this reason, a simplified constitution is required.

An object of an aspect of the present disclosure is to provide a notch filter in which a simplified constitution can be achieved.

A notch filter according to the aspect of the present disclosure includes a protective element connected between a signal line and a ground. The protective element has a capacitive component and outputs a signal with a second frequency different from a signal with a first frequency flowing in the signal line and a signal with the second frequency superimposed on the signal line to the ground.

In the notch filter according to the aspect of the present disclosure, the protective element has a capacitive component. The protective element having the capacitive component breaks down, becomes low-resistant, and causes a current to flow when a voltage equal to or higher than a predetermined value is applied. For this reason, in the notch filter, since a current flows in the protective element when various kinds of surge occur, an electronic circuit to which the notch filter is connected can be protected. In addition, in the notch filter, the protective element outputs a signal with the second frequency different from a signal with the first frequency flowing in the signal line and a signal with the second frequency superimposed on the signal line to the ground. Accordingly, in the notch filter, noise which interferes with the signal line and is superimposed thereon can be attenuated. In this manner, in the notch filter, noise attenuation and surge protection can be performed by the protective element. That is, the protective element has two functions of noise attenuation and surge protection. For this reason, in the notch filter, noise attenuation and surge protection can be performed without providing the two components of an LC circuit and a varistor. Therefore, in the notch filter, a simplified constitution can be achieved. As a result, since reduction of the number of components and space-saving in a mounting area can be achieved, miniaturization of a product can be achieved.

According to the embodiment, an insertion loss in a signal with the second frequency may be 10 dB or greater. In this constitution, a signal with the second frequency can be effectively attenuated.

According to the embodiment, a resonance frequency of the protective element and the second frequency may be equivalent to each other. In this constitution, the protective element attenuates a signal in the resonance frequency. For this reason, in the notch filter, a signal with the second frequency can be attenuated by setting the resonance frequency of the protective element to the second frequency.

According to the embodiment, a resonance frequency of the protective element may be 2.4 GHz or 5.3 GHz. In this constitution, a signal of 2.4 GHz or 5.3 GHz can be attenuated.

According to the embodiment, an electrostatic capacitance of the capacitive component of the protective element may be 20 pF or smaller. In this constitution, the resonance frequency shifts to a higher frequency side due to a low capacitance so that noise can be attenuated even for a signal on a higher frequency side.

According to the embodiment, the protective element may include an element body having a pair of end surfaces facing each other in a first direction, a pair of main surfaces facing each other in a second direction, and a pair of side surfaces facing each other in a third direction; a first internal electrode and a second internal electrode disposed inside the element body and disposed in a manner of partially overlapping each other in the second direction; and a first external electrode having the first internal electrode connected thereto and disposed on a side of one of the end surfaces, and a second external electrode having the second internal electrode connected thereto and disposed on a side of the other of the end surfaces. A distance between one of the end surfaces and an end of the second internal electrode on the side of one of the end surfaces in the first direction and a distance between the other of the end surfaces and an end of the first internal electrode on the side of the other of the end surfaces in the first direction may be longer than a distance between one of the side surfaces and an end of each of the first internal electrode and the second internal electrode on a side of one of the side surfaces in the third direction and a distance between the other of the side surfaces and an end of each of the first internal electrode and the second internal electrode on a side of the other of the side surfaces in the third direction. In this constitution, since an area in which the first internal electrode and the second internal electrode overlap each other in the second direction can be appropriately set, individual variations at the time of manufacturing the protective element can be reduced. In addition, due to the foregoing constitution, a desired withstand voltage can be set for surge protection, and a predetermined equivalent series resistance (ESR) can be set.

According to the embodiment, a distance between the first internal electrode or the second internal electrode disposed closest to one of the main surfaces and one of the main surfaces in the third direction and a distance between the first internal electrode or the second internal electrode disposed closest to the other of the main surfaces in the third direction may be equal to or shorter than a distance between one of the side surfaces and an end of each of the first internal electrode and the second internal electrode on a side of one of the side surfaces in the third direction and a distance between the other of the side surfaces and an end of each of the first internal electrode and the second internal electrode on a side of the other of the side surfaces in the third direction. In this constitution, since an area in which the first internal electrode and the second internal electrode overlap each other in the second direction can be appropriately set, individual variations at the time of manufacturing the protective element can be reduced. In addition, due to the foregoing constitution, a desired withstand voltage can be set for surge protection, and a predetermined ESR can be set.

According to the embodiment, the protective element may include an element body, a cavity portion provided inside the element body, a pair of internal electrodes provided inside the element body, and a pair of external electrodes connected to the pair of internal electrodes. The pair of internal electrodes may extend in the first direction. The cavity portion may include a gap region positioned between the pair of internal electrodes. In this manner, the protective element may be a so-called suppressor.

According to the aspect of the present disclosure, it is possible to achieve a simplified constitution.

DETAILED DESCRIPTION

Figure 1:
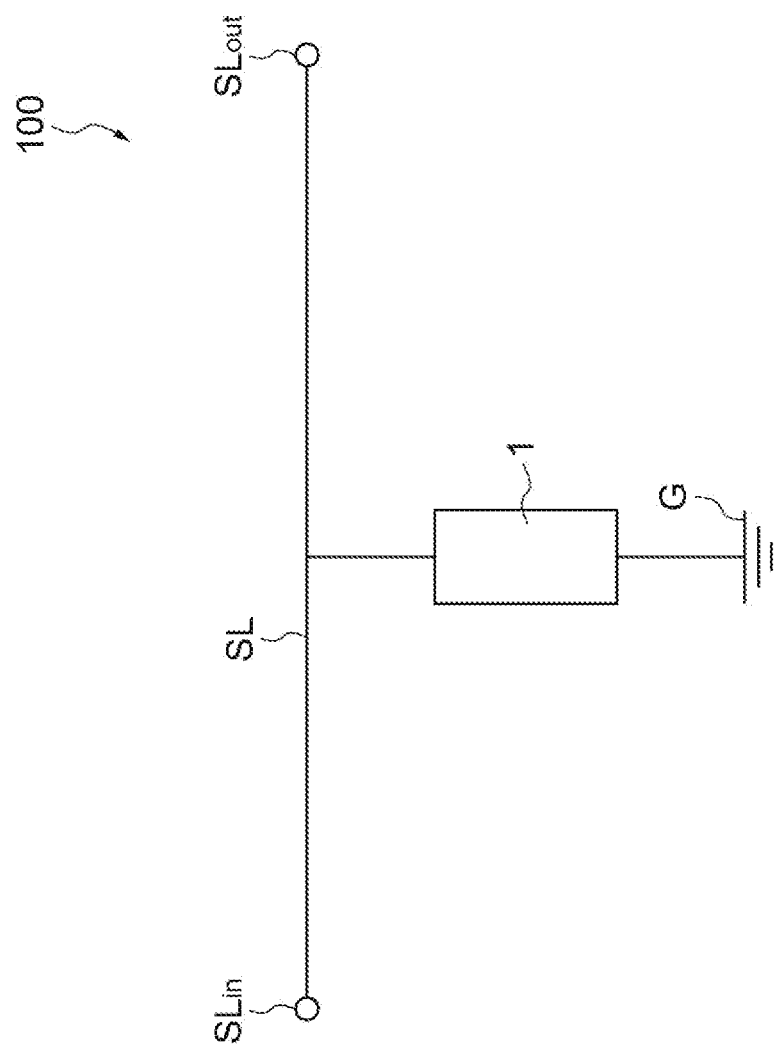
FIG. 1 is a view illustrating a notch filter.

Hereinafter, with reference to the accompanying drawings, preferred embodiments of the present disclosure will be described in detail. In the drawings, the same reference signs are applied to elements which are the same or corresponding, and duplicate description thereof will be omitted.

A notch filter 100 illustrated in FIG. 1 is a filter for protecting protection target equipment (for example, an integrated circuit (IC)) when a large voltage (surge voltage) flows into a signal line SL due to ESD or the like. In addition, the notch filter 100 is a filter for noise attenuation (a noise component in an audible band such as TDMA noise) when a signal with a frequency other than a particular frequency flows in the signal line SL. For example, the notch filter 100 may be applied to wireless equipment (wireless audio and the like) due to high attenuation characteristics thereof in a Bluetooth band or a Wi-Fi band.

The notch filter 100 includes a varistor (protective element) 1 connected between the signal line SL and a ground G. The signal line SL has an input end $SL_{in}$ and an output end $SL_{out}$. The output end $SL_{out}$ of the signal line SL is connected to equipment which becomes a target of surge protection and noise attenuation. The signal line SL outputs a signal input from the input end $SL_{in}$ to the foregoing equipment through the output end $SL_{out}$. A signal (control signal) with a predetermined frequency (first frequency) input from the input end $SL_{in}$ flows in the signal line SL.

When a signal with a frequency (second frequency) different from the predetermined frequency is superimposed on the signal line SL, the notch filter 100 attenuates the signal (which will hereinafter be referred to as "a noise signal") with the superimposed frequency (which will hereinafter be referred to as "a superimposed frequency"). Being superimposed denotes that communication radio waves of Bluetooth or Wi-Fi interfere with the signal line SL and intrude into the signal line SL. In the varistor 1 of the notch filter 100, a resonance frequency is set so as to correspond to the superimposed frequency of a noise signal to be attenuated. That is, the resonance frequency of the varistor 1 is set in accordance with the superimposed frequency. The resonance frequency of the varistor 1 is set to be equivalent to the superimposed frequency. Regarding "being equivalent" in the present embodiment, a value including a minute difference, a manufacturing error, or the like within a range set in advance may be regarded as being equivalent in addition to being equal. For example, when a plurality of values are included within a range of ±5% of the average value of the plurality of values, the plurality of values are defined as equivalent values.

The varistor 1 of the notch filter 100 is constituted to operate when a predetermined voltage or higher is applied. A predetermined voltage is a varistor voltage (operation voltage). The varistor voltage may also be referred to as a breakdown voltage. In the notch filter 100, a noise signal which has intruded into the signal line SL and a large voltage which has flowed into the signal line SL are output to the ground G after bypassing the varistor 1.

[First embodiment] Regarding the varistor 1 according to a first embodiment, a varistor having a resonance frequency of 2.4 GHz will be described. The varistor 1 attenuates a signal with a resonance frequency. That is, the varistor 1 attenuates a noise signal of 2.4 GHz which has been superimposed on the signal line SL. In the notch filter 100 including the varistor 1, for example, in wireless audio performing communication at 2.4 GHz, when a noise signal with a frequency of 2.4 GHz is superimposed on the signal line SL, the varistor 1 attenuates the noise signal of 2.4 GHz. The varistor 1 attenuates a noise signal such that an insertion loss in the noise signal of 2.4 GHz becomes 10 dB or greater.

The varistor 1 has a capacitive component. The electrostatic capacitance of the varistor 1 is 20 pF or smaller, and for example, it is 12 to 18 pF. The electrostatic capacitance is an electrostatic capacitance between a first external electrode 3 and a second external electrode 4 with an oscillator frequency of 1 kHz or 1 MHz and an oscillator voltage of 1

Vrms. The breakdown voltage of the varistor 1 is 16 V, for example. The breakdown voltage is a voltage between the first external electrode 3 and the second external electrode 4 when a direct current (DC) of 1 mA flows. An ESD withstand amount (withstand voltage) of the varistor 1 is 8 kV, for example.

Figure 2:
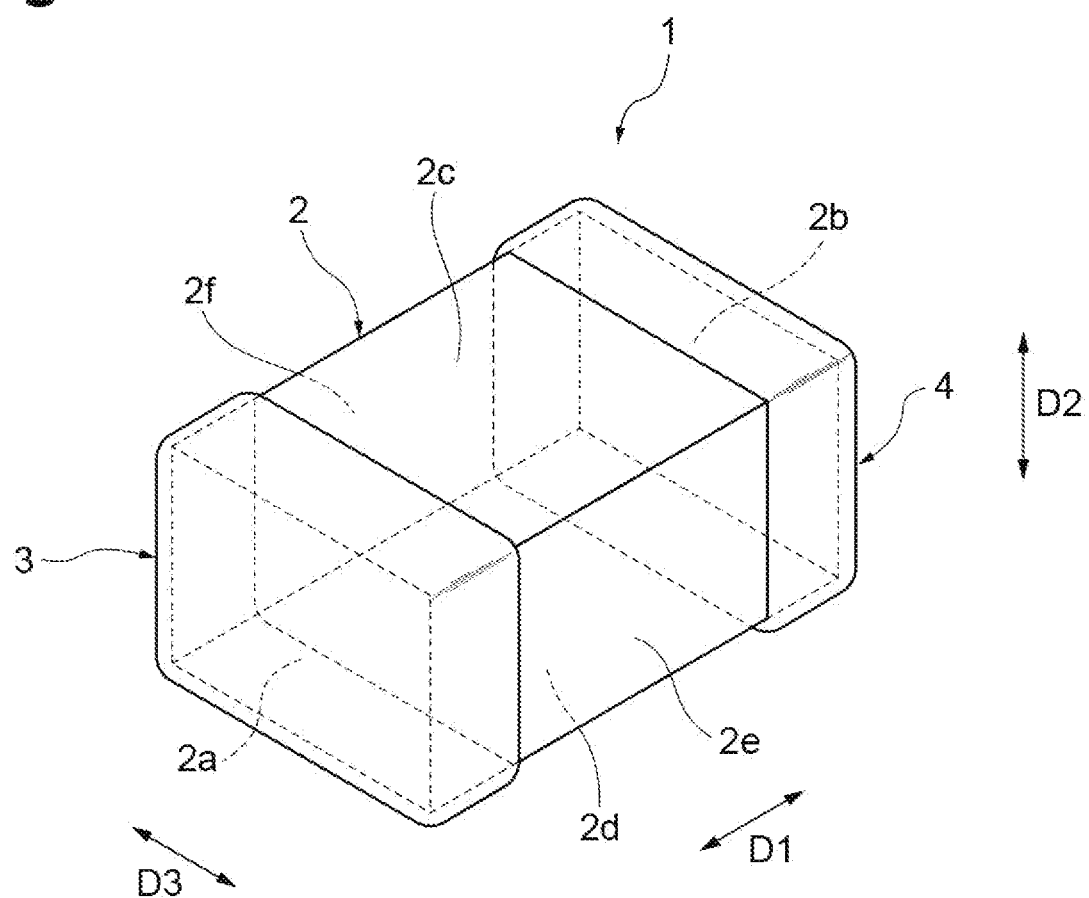
FIG. 2 is a perspective view illustrating a varistor.

As illustrated in FIG. 2, the varistor 1 includes an element body 2, the first external electrode 3, the second external electrode 4, first internal electrodes 5, and second internal electrodes 6.

The element body 2 exhibits a rectangular parallelepiped shape. A rectangular parallelepiped shape includes a rectangular parallelepiped shape in which corner portions and ridgeline portions are chamfered and a rectangular parallelepiped shape in which corner portions and ridgeline portions are rounded. The element body 2 has a pair of end surfaces 2a and 2b, a pair of main surfaces 2c and 2d, and a pair of side surfaces 2e and 2f as outer surfaces. The end surfaces 2a and 2b face each other. The main surfaces 2c and 2d face each other. The side surfaces 2e and 2f face each other. Hereinafter, the facing direction of the end surfaces 2a and 2b will be regarded as a first direction D1, the facing direction of the main surfaces 2c and 2d will be regarded as a second direction D2, and the facing direction of the side surfaces 2e and 2f will be regarded as a third direction D3. The first direction D1, the second direction D2, and the third direction D3 are substantially orthogonal to each other.

The end surfaces 2a and 2b extend in the second direction D2 in a manner of joining the main surfaces 2c and 2d. The end surfaces 2a and 2b also extend in the third direction D3 in a manner of joining the side surfaces 2e and 2f. The main surfaces 2c and 2d extend in the first direction D1 in a manner of joining the end surfaces 2a and 2b. The main surfaces 2c and 2d also extend in the third direction D3 in a manner of joining the side surfaces 2e and 2f. The side surfaces 2e and 2f extend in the first direction D1 in a manner of joining the end surfaces 2a and 2b. The side surfaces 2e and 2f also extend in the second direction D2 in a manner of joining the main surfaces 2c and 2d.

The main surface 2d is a mounting surface. It is a surface facing other electronic equipment, for example, when the varistor 1 is mounted in other electronic equipment (not illustrated, for example, a circuit base material or a laminated electronic component). The end surfaces 2a and 2b are continuous surfaces from the mounting surface (that is, the main surface 2d).

The length of the element body 2 in the first direction D1 is longer than the length of the element body 2 in the second direction D2 and the length of the element body 2 in the third direction D3. The length of the element body 2 in the second direction D2 is shorter than the length of the element body 2 in the third direction D3. That is, in the present embodiment, the end surfaces 2a and 2b, the main surfaces 2c, and 2d and the side surfaces 2e and 2f exhibit rectangular shapes. The length of the element body 2 in the second direction D2 may be equivalent to the length of the element body 2 in the third direction D3 or may be longer than the length of the element body 2 in the third direction D3.

The element body 2 is constituted of a plurality of laminated dielectric layers. For example, each of the dielectric layers may include zinc oxide (ZnO) as a main component and may include Co, a rare earth metal element, a Group IIIb element (B, Al, Ga, or In), Si, Cr, Mo, a simple substance of a metal such as an alkaline metal element (K, Rb, or Cs) or an alkaline earth metal element (Mg, Ca, Sr, or Ba), and an oxide of these as sub-components.

The first external electrode 3 is disposed on the end surface 2a side of the element body 2, and the second external electrode 4 is disposed on the end surface 2b side of the element body 2. That is, the first external electrode 3 and the second external electrode 4 are positioned apart from each other in the facing direction of the pair of end surfaces 2a and 2b.

The first external electrode 3 is disposed on the end surface 2a on one side. The first external electrode 3 includes five electrode parts including a first electrode part positioned on the end surface 2a, a second electrode part positioned on the main surface 2c, a third electrode part positioned on the main surface 2d, a fourth electrode part positioned on the side surface 2e, and a fifth electrode part positioned on the side surface 2f. The first external electrode 3 is formed on five surfaces of one end surface 2a, the pair of main surfaces 2c and 2d, and the pair of side surfaces 2e and 2f. The first electrode part, the second electrode part, the third electrode part, the fourth electrode part, and the fifth electrode part are integrally formed.

Figure 3:
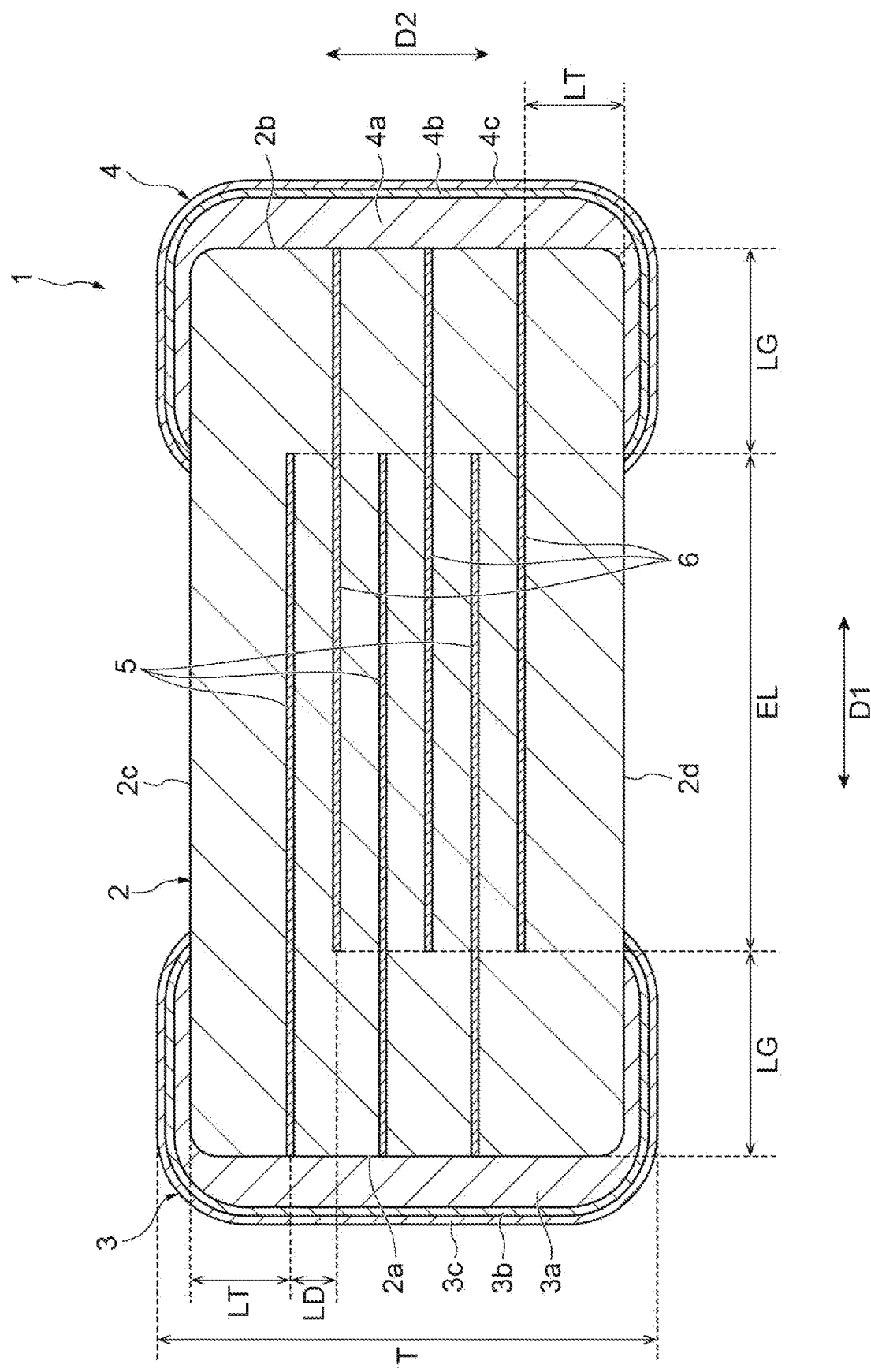
FIG. 3 is a view illustrating a cross-sectional constitution of the varistor according to a first embodiment.
Figure 4:
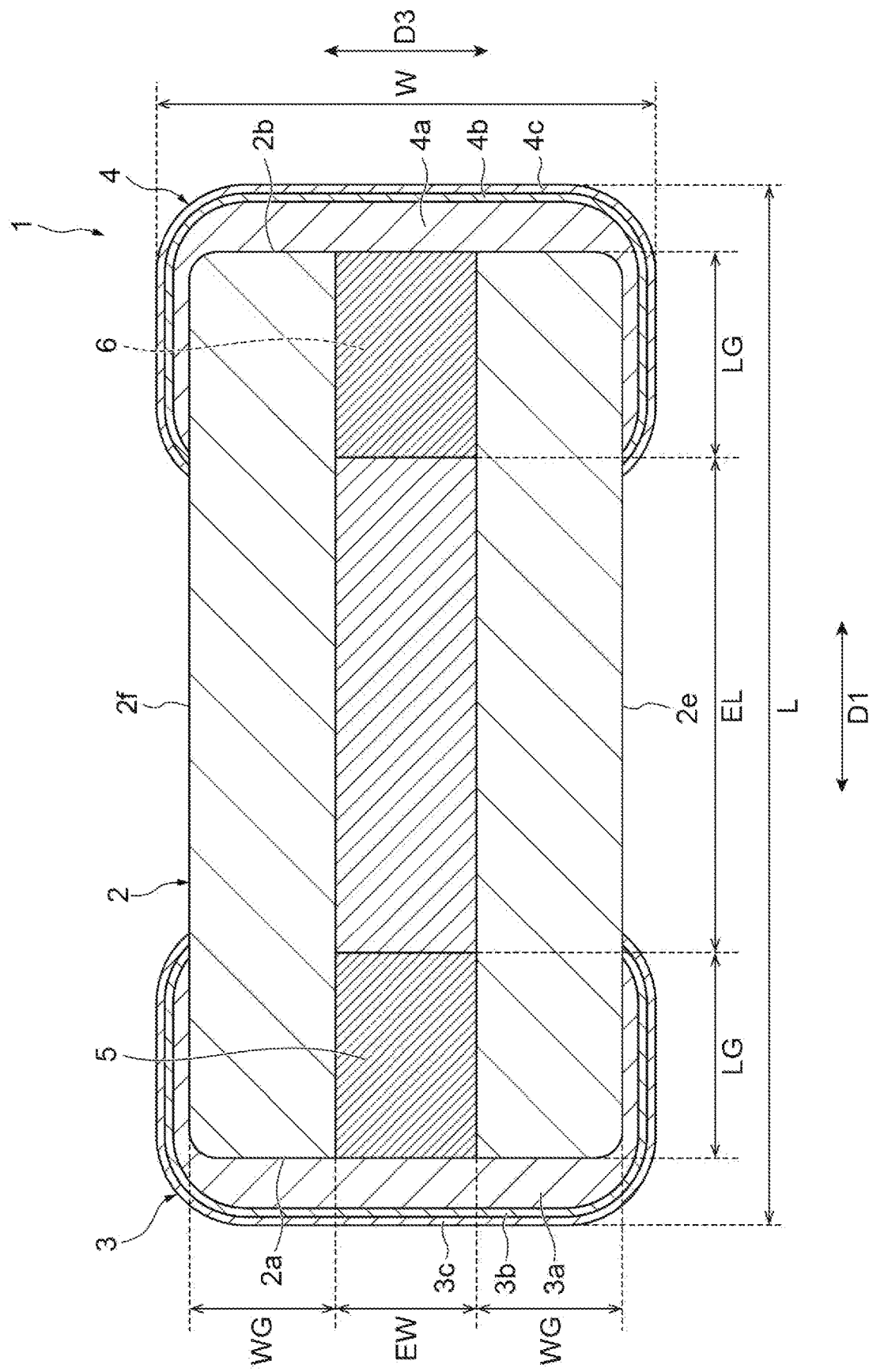
FIG. 4 is a view illustrating another cross-sectional constitution of the varistor according to the first embodiment.

As illustrated in FIGS. 3 and 4, the first external electrode 3 has a baked electrode layer 3a, a first plating layer 3b, and a second plating layer 3c. The baked electrode layer 3a includes a conductive material. For example, the baked electrode layer 3a is constituted as a sintered body of a conductive paste including a conductive metal powder (powder of Ag and/or Pd) and a glass frit. The first plating layer 3b is disposed on the baked electrode layer 3a. For example, the first plating layer 3b is a Ni plating layer formed by Ni plating. The second plating layer 3c is disposed on the first plating layer 3b. For example, the second plating layer 3c is a Sn plating layer formed by Sn plating.

The second external electrode 4 is disposed on the end surface 2b on the other side. The second external electrode 4 includes five electrode parts including a first electrode part positioned on the end surface 2b, a second electrode part positioned on the main surface 2c, a third electrode part positioned on the main surface 2d, a fourth electrode part positioned on the side surface 2e, and a fifth electrode part positioned on the side surface 2f. The second external electrode 4 is formed on five surfaces of one end surface 2b, the pair of main surfaces 2c and 2d, and the pair of side surfaces 2e and 2f. The first electrode part, the second electrode part, the third electrode part, the fourth electrode part, and the fifth electrode part are integrally formed.

The second external electrode 4 has a baked electrode layer 4a, a first plating layer 4b, and a second plating layer 4c. The baked electrode layer 4a includes a conductive material. For example, the baked electrode layer 4a is constituted as a sintered body of a conductive paste including a conductive metal powder (powder of Ag and/or Pd) and a glass frit. The first plating layer 4b is disposed on the baked electrode layer 4a. For example, the first plating layer 4b is a Ni plating layer formed by Ni plating. The second plating layer 4c is disposed on the first plating layer 4b. For example, the second plating layer 4c is a Sn plating layer formed by Sn plating.

The first internal electrodes 5 and the second internal electrodes 6 are formed of a conductive material generally used for internal electrodes of a lamination-type electrical element. For example, Pd is used as a conductive material. The first internal electrodes 5 and the second internal electrodes 6 are constituted as sintered bodies of conductive pastes including the foregoing conductive material.

A plurality of first internal electrodes 5 and a plurality of second internal electrodes 6 are disposed respectively. In the present embodiment, three first internal electrodes 5 and three second internal electrodes 6 are disposed respectively. The first internal electrodes 5 and the second internal electrodes 6 are disposed at different positions (layers) in the second direction D2. That is, the first internal electrodes 5 and the second internal electrodes 6 are alternately disposed in a manner of facing each other with a gap therebetween in the second direction D2 inside the element body 2. The first internal electrodes 5 and the second internal electrodes 6 have polarities different from each other. The first internal electrodes 5 have end portions which are connected to the first external electrode 3. The second internal electrodes 6 have end portions which are connected to the second external electrode 4.

Subsequently, dimensions of each portion of the varistor 1 will be described. As illustrated in FIG. 3 or 4, a length L (L dimension) of the varistor 1 is 380 to 420 μm, for example, and it is 400 μm in the present embodiment. A width W (W dimension) of the varistor 1 is 180 to 220 μm, for example, and it is 200 μm, in the present embodiment. A height T (T dimension) of the varistor 1 is 180 to 220 μm, and it is 200 μm in the present embodiment.

An overlapping length EL of the first internal electrodes 5 and the second internal electrodes 6 in the second direction D2 is 190 μm, for example. An overlapping width EW of the first internal electrodes 5 and the second internal electrodes 6 in the second direction D2 is 58 μm, for example. In the present embodiment, the width EW is equivalent to the widths of the first internal electrodes 5 and the second internal electrodes 6 in the third direction D3. In the varistor 1, the length EL is larger than the width EW (EL>EW). In other words, the width EW is smaller than the length EL (EW<EL). An overlapping area of the first internal electrodes 5 and the second internal electrodes 6 is regulated by the length EL and the width EW.

A distance LG (L gap) between ends of the first internal electrodes 5 on the end surface 2b side and the end surface 2b is 80 μm, for example. The distance LG between ends of the second internal electrodes 6 on the end surface 2a side and the end surface 2a is 80 μm, for example. A distance WG (W gap) between the ends of the first internal electrodes 5 and the second internal electrodes 6 on the side surface 2e side and the side surface 2e is 62 μm, for example. The distance WG between the ends of the first internal electrodes 5 and the second internal electrodes 6 on the side surface 2f side and the side surface 2f is 62 μm, for example.

A distance LD (interlayer distance) between the first internal electrodes 5 and the second internal electrodes 6 in the second direction D2 is 20 μm, for example. A distance LT between the first internal electrode 5 disposed at a position closest to the main surface 2c and the main surface 2c in the second direction D2 is 45 μm, for example. The distance LT between the second internal electrode 6 disposed at a position closest to the main surface 2d and the main surface 2d in the second direction D2 is 45 μm, for example. In the varistor 1, the distance LD is shorter than the distance LT (LD<LT). In other words, the distance LT is longer than the distance LD (LT>LD). In the varistor 1, the distance LT is shorter than the distance WG (LT<WG). In other words, the distance WG is longer than the distance LT (WG>LT). Thicknesses of the first internal electrodes 5 and the second internal electrodes 6 are 1 to 2 μm, for example.

In the varistor 1, a resonance frequency is set by setting dimensions of each of the foregoing portions. The varistor 1 shifts to a higher frequency side when the overlapping area of the first internal electrodes 5 and the second internal electrodes 6 (the length EL and the width EW) is reduced, and the varistor 1 shifts to a lower frequency side when the overlapping area thereof is increased. In the varistor 1, an equivalent series resistance (ESR) is set by suitably setting the number of first internal electrodes 5 and second internal electrodes 6, the widths (W gaps) of the first internal electrodes 5 and the second internal electrodes 6, the thicknesses of the first internal electrodes 5 and the second internal electrodes 6, and the distance LD between the first internal electrodes 5 and the second internal electrodes 6 in the second direction D2, and the like. Attenuation characteristics of a noise signal in the varistor 1 can be adjusted by setting the ESR.

Figure 5:
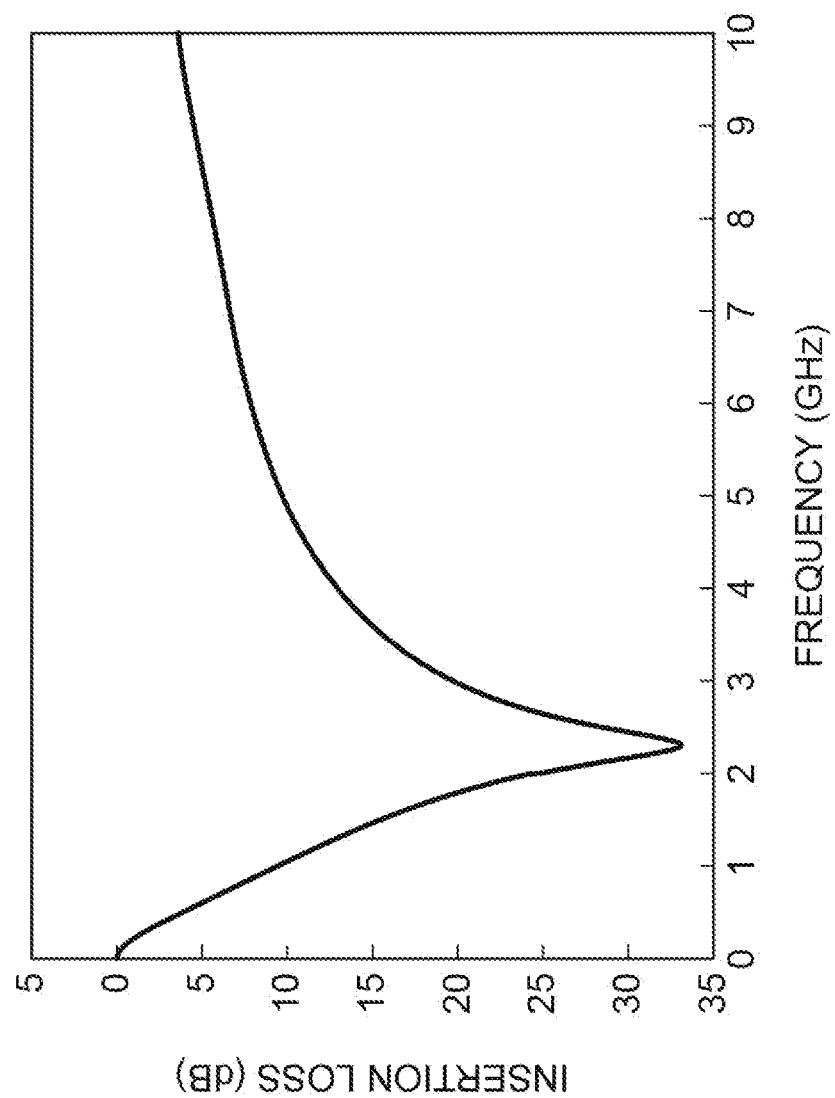
FIG. 5 is a graph showing a relationship between a frequency and an insertion loss in the notch filter including the varistor illustrated in FIGS. 3 and 4.

FIG. 5 is a graph showing a relationship between a frequency and an insertion loss in the notch filter 100 including the varistor 1 illustrated in FIGS. 3 and 4. In FIG. 5, the horizontal axis indicates a frequency [GHz], and the vertical axis indicates an insertion loss [dB]. As illustrated in FIG. 5, in the notch filter 100 including the varistor 1 having a resonance point of 2.4 GHz, a noise signal of 2.4 GHz can be attenuated. In the example illustrated in FIG. 5, in the notch filter 100, an insertion loss in a noise signal can be set to 30 dB or greater. In the notch filter 100, in a band within a predetermined range including 2.4 GHz, an insertion loss can be set to 10 dB or greater.

As described above, in the notch filter 100 according to the present embodiment, the varistor 1 has a capacitive component. The varistor 1 having a capacitive component breaks down, becomes low-resistant, and causes a current to flow when a voltage equal to or higher than a predetermined value (breakdown voltage) is applied. For this reason, in the notch filter 100, since a current flows in the varistor 1 when various kinds of surge occur, an electronic circuit to which the notch filter 100 is connected can be protected.

In addition, in the notch filter 100, the varistor 1 outputs a noise signal with a superimposed frequency different from a signal with a predetermined frequency flowing in the signal line SL and a noise signal superimposed on the signal line SL to the ground G. Accordingly, in the notch filter 100, noise which interferes with the signal line SL and is superimposed thereon can be attenuated. In this manner, in the notch filter 100, noise attenuation and surge protection can be performed by the varistor 1. That is, the varistor 1 has two functions of noise attenuation and surge protection. For this reason, in the notch filter 100, noise attenuation and surge protection can be performed without providing two components of an LC circuit and a varistor. Therefore, in the notch filter 100, a simplified constitution can be achieved. As a result, since reduction of the number of components and space-saving in a mounting area can be achieved, miniaturization of a product can be achieved.

In order for the varistor 1 to have both functions of noise attenuation and surge protection, there is a need to set the dimensions of each portion as described above. From the viewpoint of surge protection, when the overlapping area of the first internal electrodes 5 and the second internal electrodes 6 is changed in order to increase the electrostatic capacitance, the resonance frequency shifts. On the other hand, from the viewpoint of noise attenuation of a predetermined frequency, when the overlapping area of the first internal electrodes 5 and the second internal electrodes 6 is changed in order to set the resonance frequency, the electrostatic capacitance also changed. Therefore, a withstand voltage related to surge protection may not be able to be secured. In this manner, design becomes complicated in order for the varistor 1 to have both functions of noise attenuation of a predetermined frequency and surge protection that guarantees a constant withstand voltage. For this reason, in the related art, an LC circuit is provided for noise attenuation and a varistor is provided for surge protection to avoid complicated design. In the notch filter 100 according to the present embodiment, the varistor 1 having both functions of noise attenuation and surge protection is realized by setting the dimensions of each portion as described above.

In the notch filter 100 according to the present embodiment, in the varistor 1, the length EL is larger than the width EW (EL>EW). In this constitution, since the area in which the first internal electrodes 5 and the second internal electrodes 6 overlap each other in the second direction D2 can be appropriately set, individual variations at the time of manufacturing the varistor 1 can be reduced. In addition, due to the foregoing constitution, a desired withstand voltage can be set for surge protection, and a predetermined ESR can be set.

In the notch filter 100 according to the present embodiment, in the varistor 1, the distance LT is shorter than the distance WG (LT<WG). In this constitution, since the area in which the first internal electrodes 5 and the second internal electrodes 6 overlap each other in the second direction D2 can be appropriately set, individual variations at the time of manufacturing the varistor 1 can be reduced. In addition, due to the foregoing constitution, a desired withstand voltage can be set for surge protection, and a predetermined ESR can be set.

[Second embodiment] Subsequently, with reference to FIGS. 6 and 7, regarding a varistor 1A according to a second embodiment, a varistor having a resonance frequency of 2.4 GHz will be described. The varistor 1A attenuates a signal with a resonance frequency superimposed on the signal line SL. That is, the varistor 1A attenuates a signal of 2.4 GHz.

The varistor 1A has a capacitive component. The electrostatic capacitance of the varistor 1A is 20 pF or smaller, and for example, it is 8.5 to 11.5 pF. The breakdown voltage of the varistor 1A is 12.8 V, for example. The ESD withstand amount (withstand voltage) of the varistor 1A is 8 kV, for example.

Figure 6:
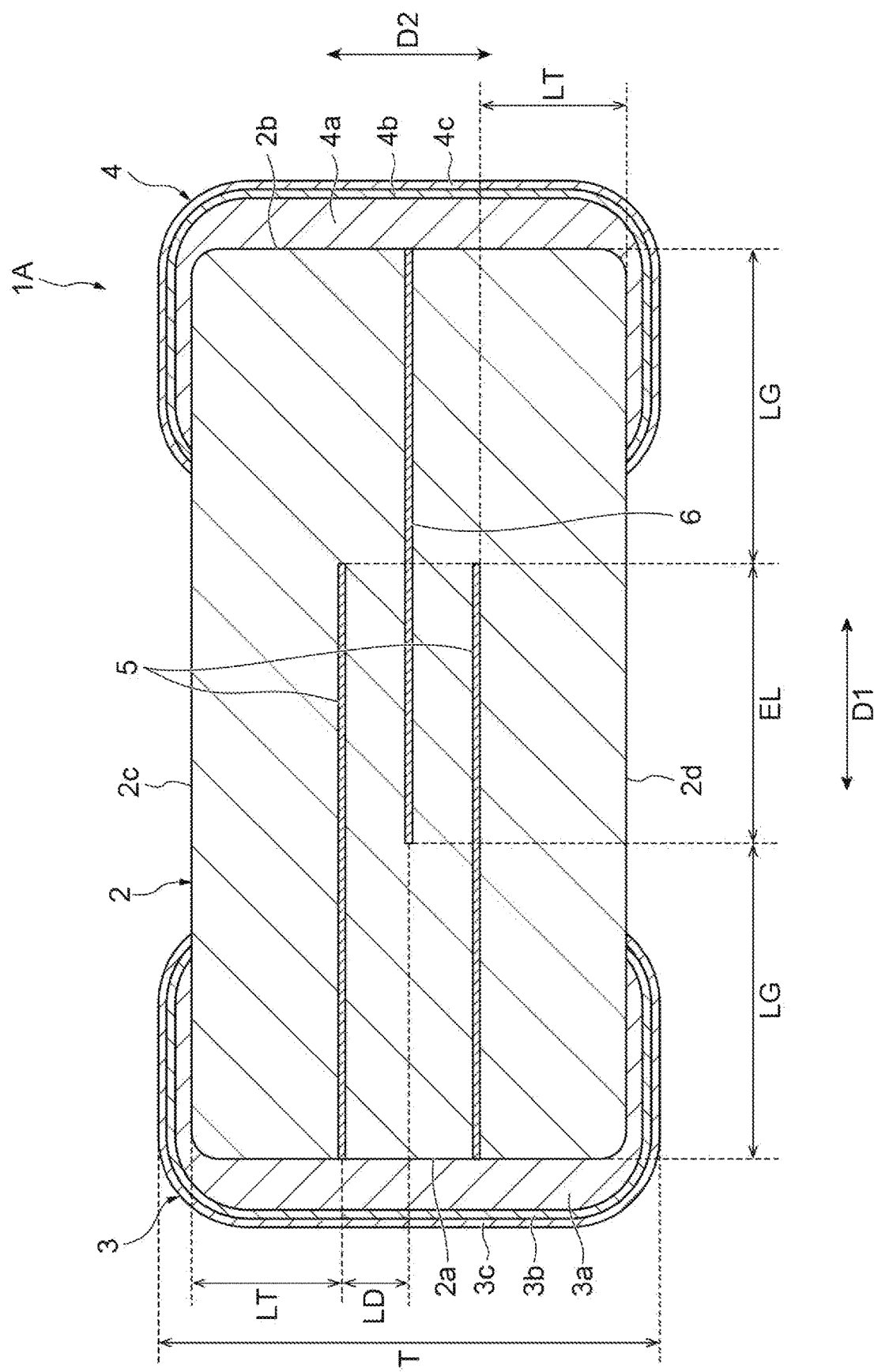
FIG. 6 is a view illustrating a cross-sectional constitution of a varistor according to a second embodiment.
Figure 7:
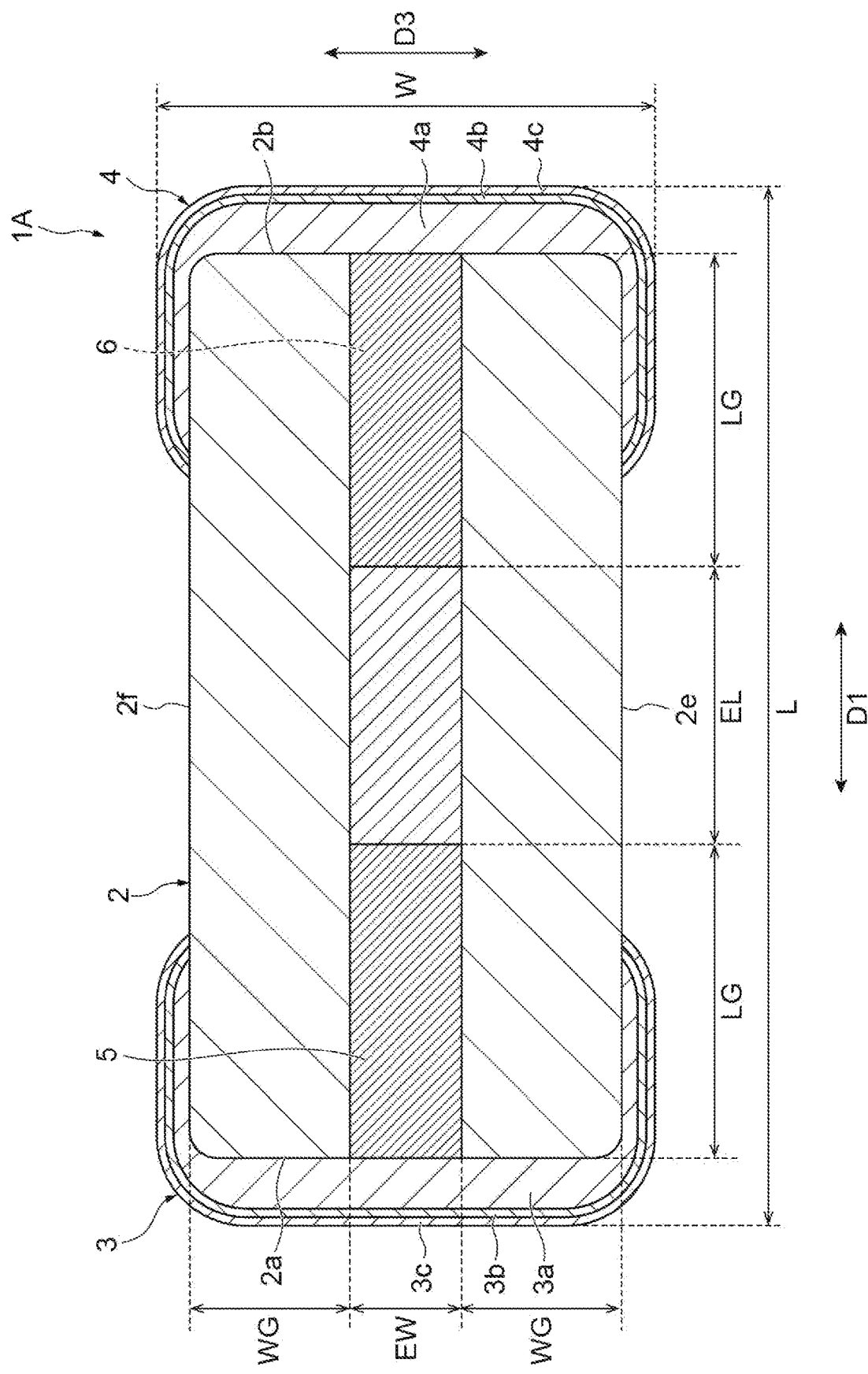
FIG. 7 is a view illustrating another cross-sectional constitution of the varistor according to the second embodiment.

As illustrated in FIGS. 6 and 7, the varistor 1A includes the element body 2, the first external electrode 3, the second external electrode 4, the first internal electrodes 5, and the second internal electrode 6.

In the varistor 1A, two first internal electrodes 5 are disposed. One second internal electrode 6 is disposed. The first internal electrodes 5 and the second internal electrode 6 are disposed at different positions (layers) in the second direction D2. That is, the first internal electrodes 5 and the second internal electrode 6 are disposed in manner of facing each other with a gap therebetween in the second direction D2 inside the element body 2. The first internal electrodes 5 and the second internal electrode 6 have polarities different from each other. The first internal electrodes 5 have end portions which are connected to the first external electrode 3. The second internal electrode 6 has an end portion which is connected to the second external electrode 4.

Subsequently, dimensions of each portion of the varistor 1A will be described. For example, the length L (L dimension) of the varistor 1A is 570 to 630 µm, and it is 600 µm in the present embodiment. For example, the width W (W dimension) of the varistor 1A is 270 to 330 µm, and it is 300 µm in the present embodiment. The height T (T dimension) of the varistor 1A is 270 to 330 µm, and it is 300 µm in the present embodiment.

The overlapping length EL of the first internal electrodes 5 and the second internal electrode 6 in the second direction D2 is 170 µm, for example. The overlapping width EW of the first internal electrodes 5 and the second internal electrode 6 in the second direction D2 is 70 µm, for example. In the present embodiment, the width EW is equivalent to the widths of the first internal electrodes 5 and the second internal electrode 6 in the third direction D3. In the varistor 1A, the length EL is larger than the width EW (EL>EW). In other words, the width EW is smaller than the length EL (EW<EL). The overlapping area of the first internal electrodes 5 and the second internal electrode 6 is regulated by the length EL and the width EW.

The distance LG between the end of the first internal electrode 5 on the end surface 2b side and the end surface 2b is 190 µm, for example. The distance LG between the end of the second internal electrode 6 on the end surface 2a side and the end surface 2a is 190 µm, for example. The distance WG between the ends of the first internal electrodes 5 and the second internal electrode 6 on the side surface 2e side and the side surface 2e is 100 µm, for example. The distance WG between the ends of the first internal electrodes 5 and the second internal electrode 6 on the side surface 2f side and the side surface 2f is 100 µm, for example.

The distance LD (interlayer distance) between the first internal electrodes 5 and the second internal electrode 6 in the second direction D2 is 35 µm, for example. The distance LT between the first internal electrode 5 disposed at a position closest to the main surface 2c and the main surface 2c in the second direction D2 is 100 µm, for example. The distance LT between the second internal electrode 6 disposed at a position closest to the main surface 2d and the main surface 2d in the second direction D2 is 100 µm, for example. In the varistor 1A, the distance LD is shorter than the distance LT (LD<LT). In other words, the distance LT is longer than the distance LD (LT>LD). In the varistor 1A, the distance LT is the same as the distance WG (LT=WG). The thicknesses of the first internal electrodes 5 and the second internal electrode 6 are 1 to 2 µm, for example.

Figure 8:
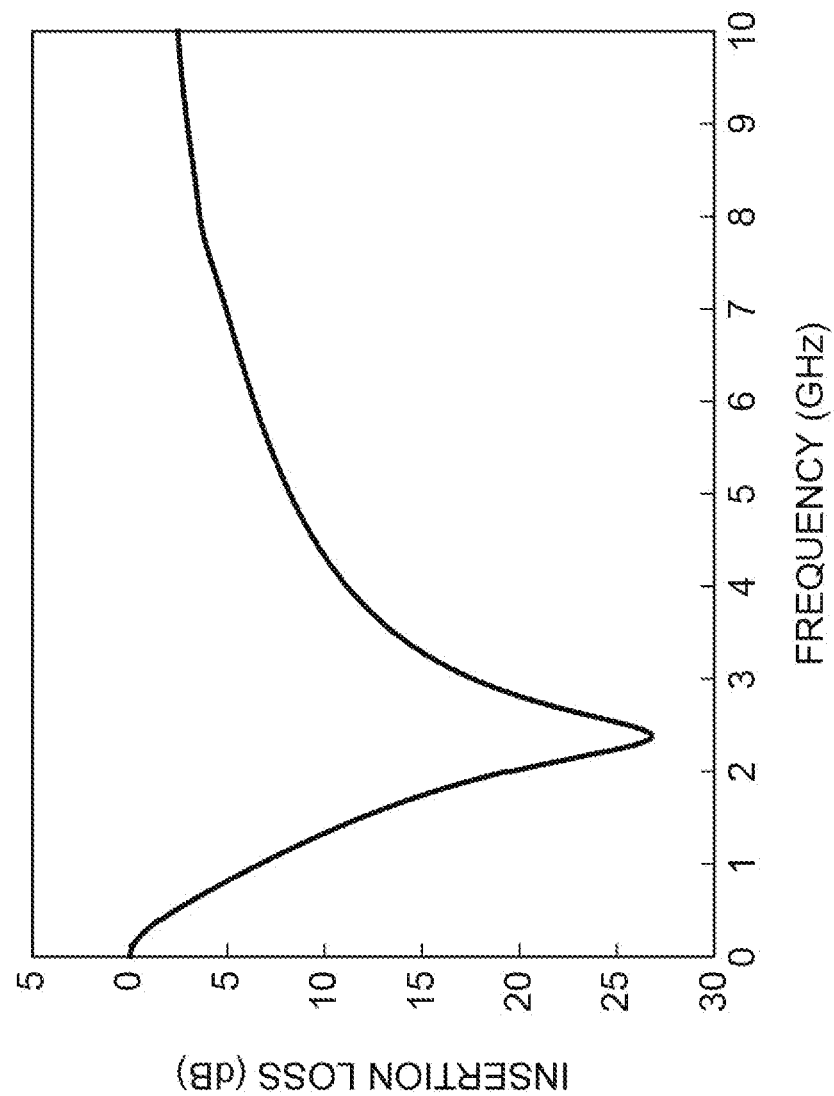
FIG. 8 is a graph showing a relationship between a frequency and an insertion loss in the notch filter including the varistor illustrated in FIGS. 6 and 7.

FIG. 8 is a graph showing a relationship between a frequency and an insertion loss in the notch filter 100 including the varistor 1A illustrated in FIGS. 6 and 7. In FIG. 8, the horizontal axis indicates a frequency [GHz], and the vertical axis indicates an insertion loss [dB]. As illustrated in FIG. 8, in the notch filter 100 including the varistor 1A having a resonance point of 2.4 GHz, a noise signal of 2.4 GHz can be attenuated. In the example illustrated in FIG. 8, in the notch filter 100, an insertion loss in a noise signal can be set to 25 dB or greater. In the notch filter 100, in a band within a predetermined range including 2.4 GHz, an insertion loss can be set to 10 dB or greater.

As described above, even in the notch filter 100 including the varistor 1A according to the present embodiment, a simplified constitution can be achieved.

[Third embodiment] Subsequently, with reference to FIGS. 9 and 10, regarding a varistor 1B according to a third embodiment, a varistor having a resonance frequency of 2.4 GHz will be described. The varistor 1B attenuates a signal with a resonance frequency superimposed on the signal line SL. That is, the varistor 1B attenuates a signal of 2.4 GHz.

The varistor 1B has a capacitive component. The electrostatic capacitance of the varistor 1B is 20 pF or smaller, and for example, it is 6.12 to 7.48 pF. The breakdown voltage of the varistor 1B is 39 V, for example. The ESD withstand amount (withstand voltage) of the varistor 1B is 8 kV, for example.

Figure 9:
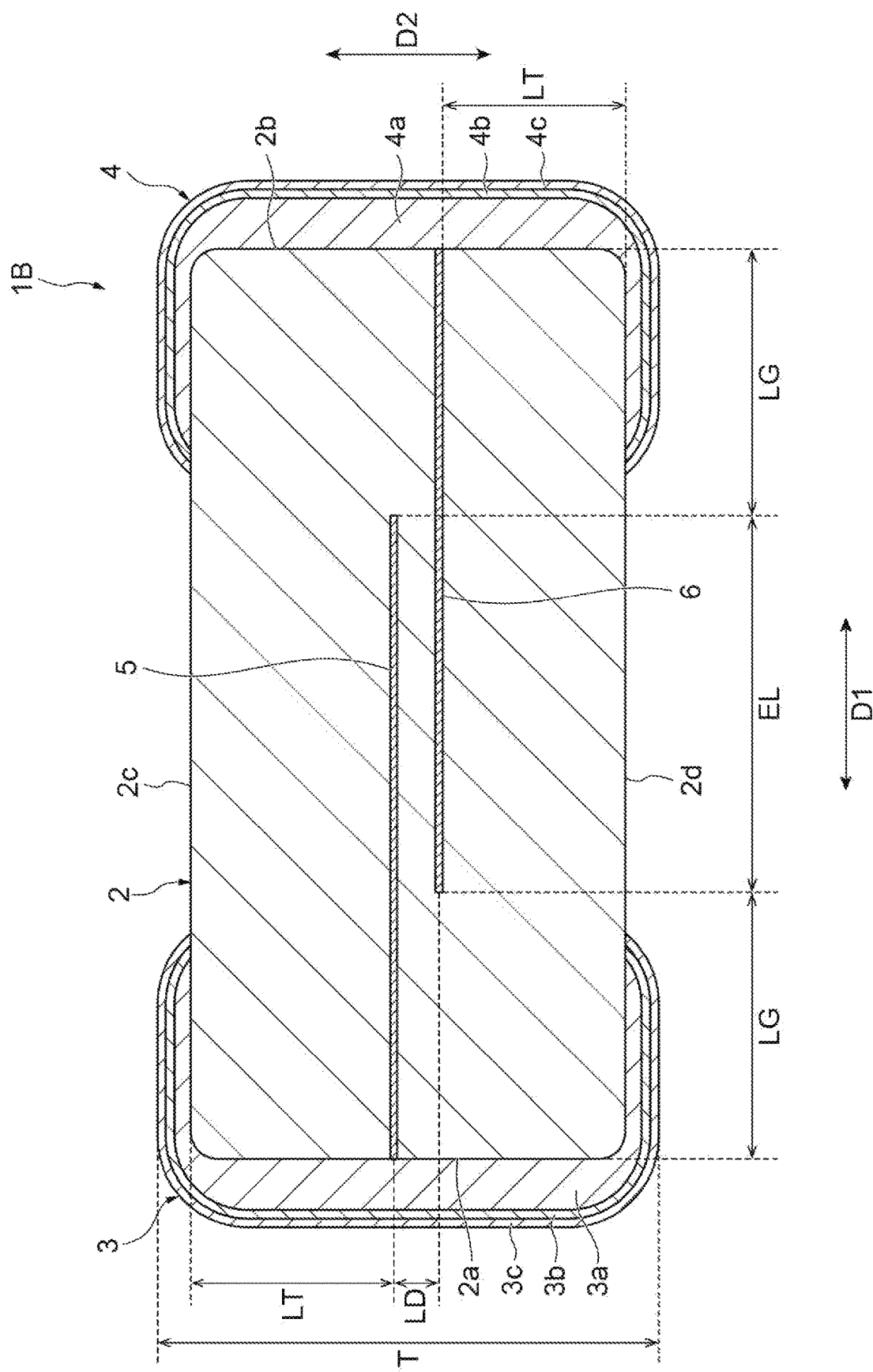
FIG. 9 is a view illustrating a cross-sectional constitution of a varistor according to a third embodiment.
Figure 10:
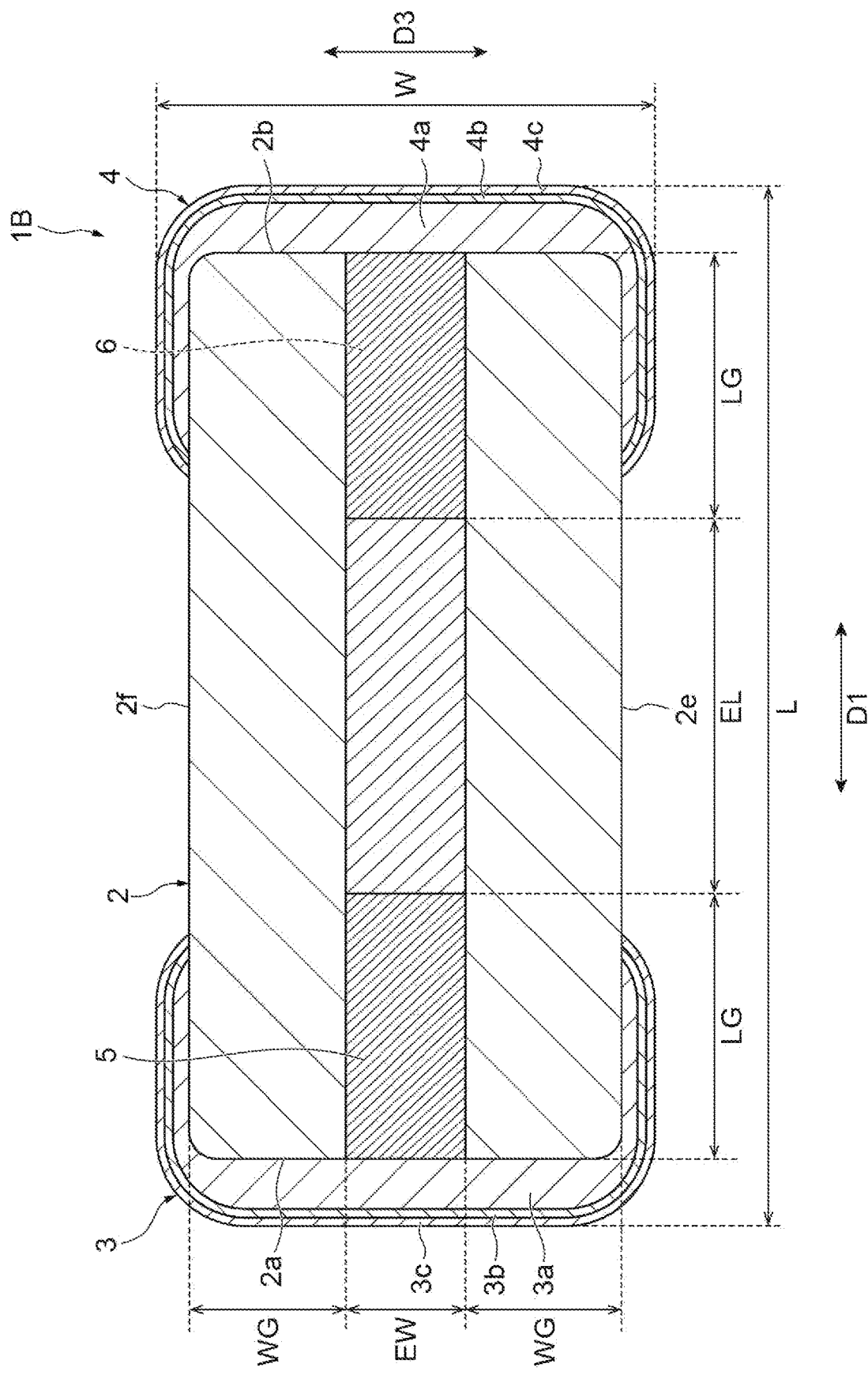
FIG. 10 is a view illustrating another cross-sectional constitution of the varistor according to the third embodiment.

As illustrated in FIGS. 9 and 10, the varistor 1B includes the element body 2, the first external electrode 3, the second external electrode 4, the first internal electrode 5, and the second internal electrode 6.

In the varistor 1B, one first internal electrode 5 and one second internal electrode 6 are disposed respectively. The first internal electrode 5 and the second internal electrode 6 are disposed at different positions (layers) in the second direction D2. That is, the first internal electrode 5 and the second internal electrode 6 are disposed in manner of facing each other with a gap therebetween in the second direction D2 inside the element body 2. The first internal electrode 5 and the second internal electrode 6 have polarities different from each other. The first internal electrode 5 has an end portion which is connected to the first external electrode 3. The second internal electrode 6 has an end portion which is connected to the second external electrode 4.

Subsequently, dimensions of each portion of the varistor 1B will be described. The length L (L dimension) of the varistor 1B is 950 to 1,050 µm, for example, and it is 1,000 µm in the present embodiment. The width W (W dimension) of the varistor 1B is 450 to 550 µm, for example, and it is 500 µm in the present embodiment. The height T (T dimension) of the varistor 1B is 450 to 550 µm, for example, and it is 500 µm in the present embodiment.

The overlapping length EL of the first internal electrode 5 and the second internal electrode 6 in the second direction D2 is 390 µm, for example. The overlapping width EW of the first internal electrode 5 and the second internal electrode 6 in the second direction D2 is 120 µm, for example. In the present embodiment, the width EW is equivalent to the widths of the first internal electrode 5 and the second internal electrode 6 in the third direction D3. In the varistor 1B, the length EL is larger than the width EW (EL>EW). In other words, the width EW is smaller than the length EL (EW<EL). The overlapping area of the first internal electrode 5 and the second internal electrode 6 is regulated by the length EL and the width EW.

The distance LG between the end of the first internal electrode 5 on the end surface 2b side and the end surface 2b is 270 µm, for example. The distance LG between the end of the second internal electrode 6 on the end surface 2a side and the end surface 2a is 270 µm, for example. The distance WG between the ends of the first internal electrode 5 and the second internal electrode 6 on the side surface 2e side and the side surface 2e is 170 µm, for example. The distance WG between the ends of the first internal electrode 5 and the second internal electrode 6 on the side surface 2f side and the side surface 2f is 170 µm, for example.

The distance LD (interlayer distance) between the first internal electrode 5 and the second internal electrode 6 in the second direction D2 is 60 µm, for example. The distance LT between the first internal electrode 5 disposed at a position closest to the main surface 2c and the main surface 2c in the second direction D2 is 200 µm, for example. The distance LT between the second internal electrode 6 disposed at a position closest to the main surface 2d and the main surface 2d in the second direction D2 is 200 µm, for example. In the varistor 1B, the distance LD is shorter than the distance LT (LD<LT). In other words, the distance LT is longer than the distance LD (LT>LD). In the varistor 1B, the distance LT is longer than the distance WG (LT>WG). In other words, the distance WG is shorter than the distance LT (WG<LT). The thicknesses of the first internal electrode 5 and the second internal electrode 6 are 1 to 2 µm, for example.

Figure 11:
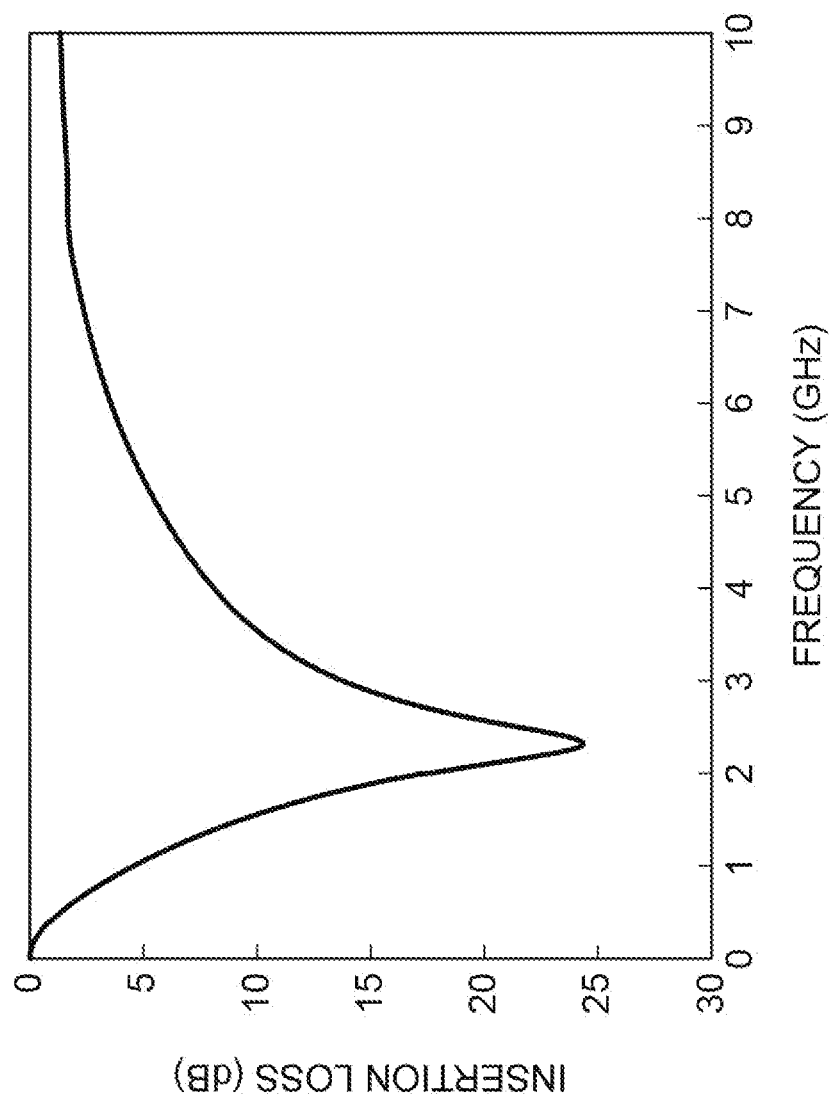
FIG. 11 is a graph showing a relationship between a frequency and an insertion loss in the notch filter including the varistor illustrated in FIGS. 9 and 10.

FIG. 11 is a graph showing a relationship between a frequency and an insertion loss in the notch filter 100 including the varistor 1B illustrated in FIGS. 9 and 10. In FIG. 11, the horizontal axis indicates a frequency [GHz], and the vertical axis indicates an insertion loss [dB]. As illustrated in FIG. 11, in the notch filter 100 including the varistor 1B having a resonance point of 2.4 GHz, a noise signal of 2.4 GHz can be attenuated. In the example illustrated in FIG. 11, in the notch filter 100, an insertion loss in a noise signal can be set to 20 dB or greater. In the notch filter 100, in a band within a predetermined range including 2.4 GHz, an insertion loss can be set to 10 dB or greater.

As described above, even in the notch filter 100 including the varistor 1B according to the present embodiment, a simplified constitution can be achieved.

[Fourth embodiment] Subsequently, with reference to FIGS. 12 and 13, regarding a varistor 1C according to a fourth embodiment, a varistor having a resonance frequency of 5.3 GHz will be described. The varistor 1C attenuates a signal with a resonance frequency superimposed on the signal line SL. That is, the varistor 1C attenuates a signal of 5.3 GHz.

The varistor 1C has a capacitive component. The electrostatic capacitance of the varistor 1C is 20 pF or smaller, and for example, it is 2.0 to 2.8 pF. The breakdown voltage of the varistor 1C is 43 V, for example. The ESD withstand amount (withstand voltage) of the varistor 1C is 8 kV, for example.

Figure 12:
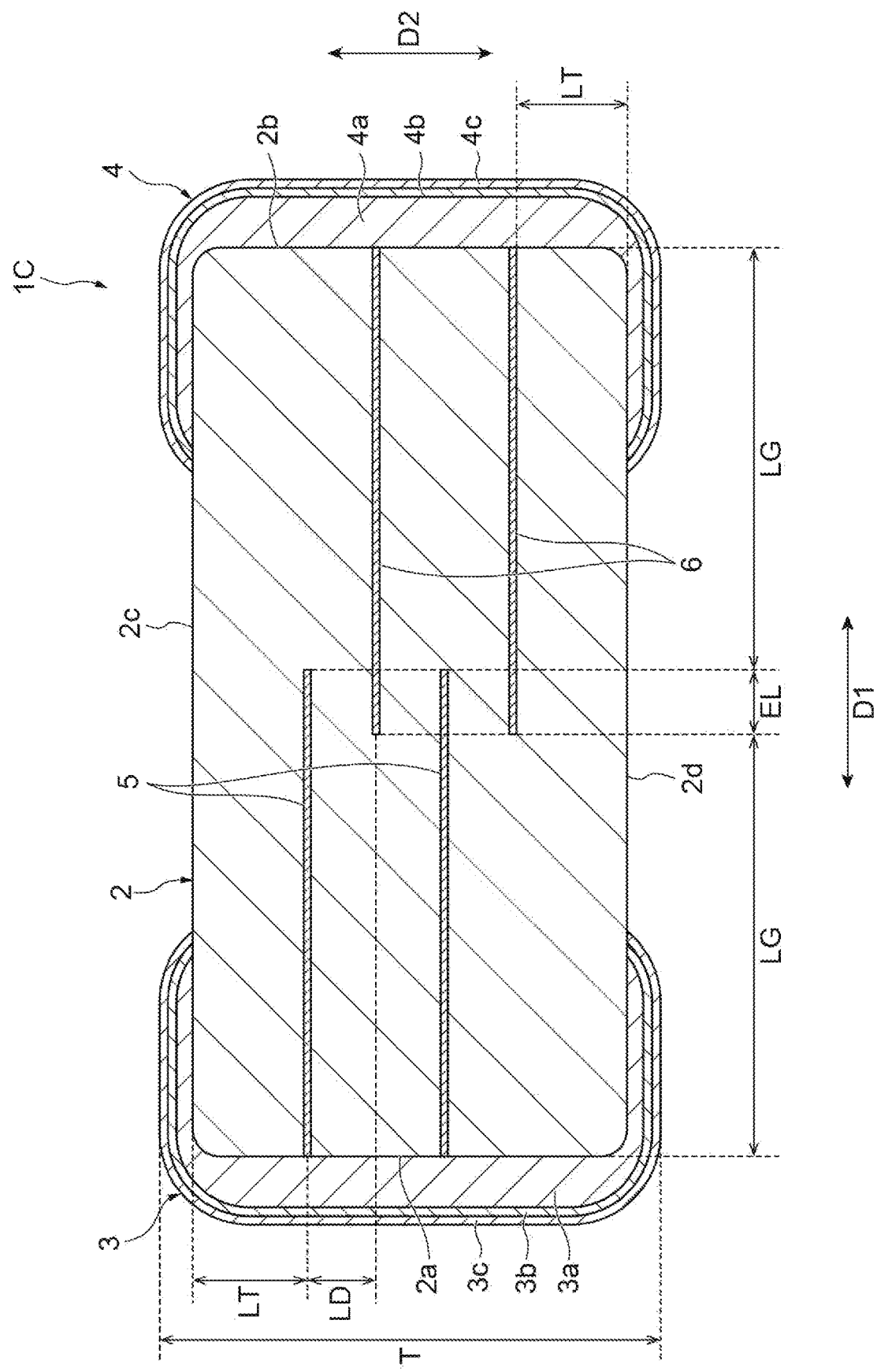
FIG. 12 is a view illustrating a cross-sectional constitution of a varistor according to a fourth embodiment.
Figure 13:
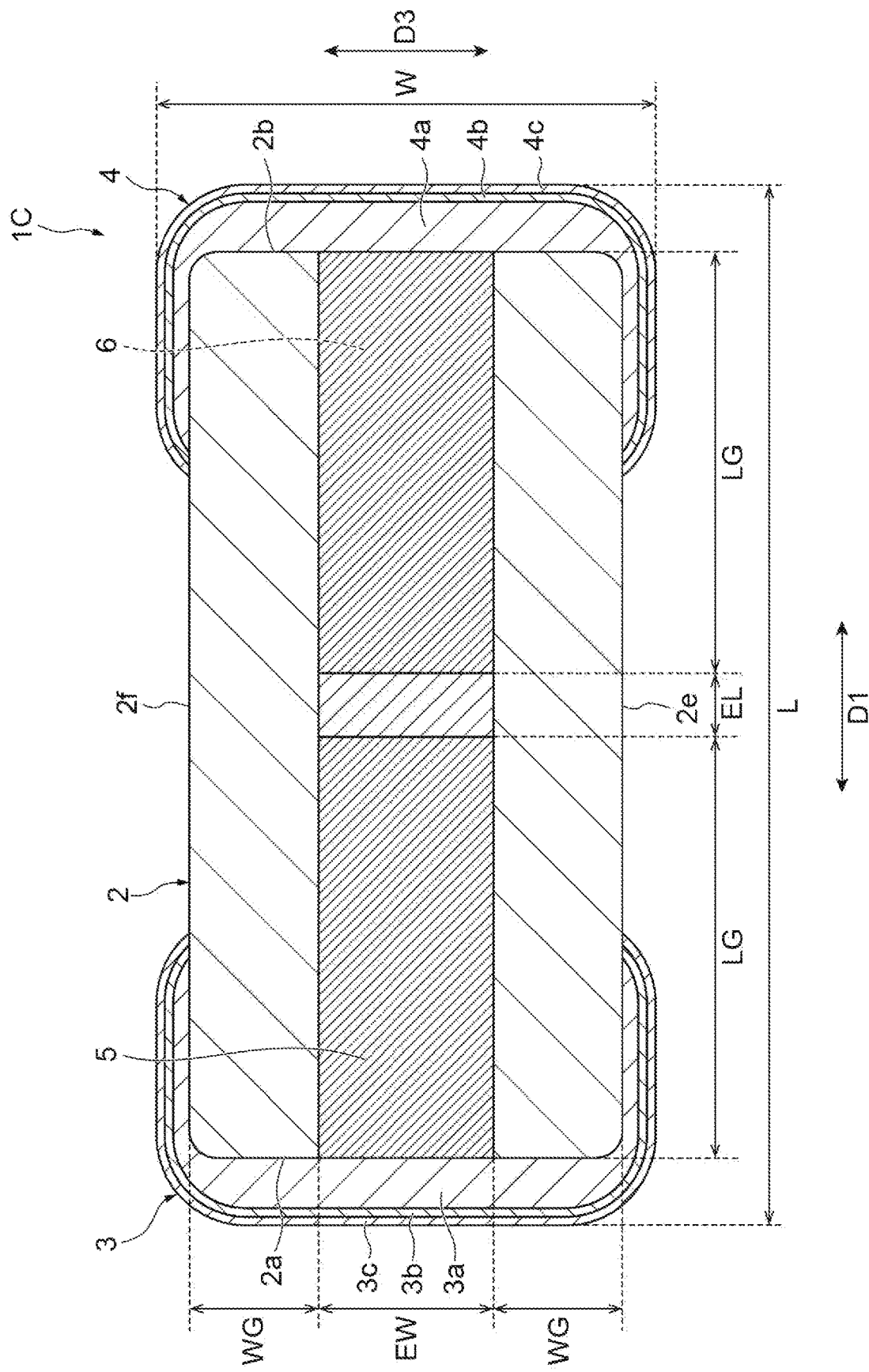
FIG. 13 is a view illustrating another cross-sectional constitution of the varistor according to the fourth embodiment.

As illustrated in FIGS. 12 and 13, the varistor 1C includes the element body 2, the first external electrode 3, the second external electrode 4, the first internal electrodes 5, and the second internal electrodes 6.

In the varistor 1C, two first internal electrodes 5 and two second internal electrodes 6 are disposed respectively. The first internal electrodes 5 and the second internal electrodes 6 are disposed at different positions (layers) in the second direction D2. That is, the first internal electrodes 5 and the second internal electrodes 6 are disposed in manner of facing each other with a gap therebetween in the second direction D2 inside the element body 2. The first internal electrodes 5 and the second internal electrodes 6 have polarities different from each other. The first internal electrodes 5 have end portions which are connected to the first external electrode 3. The second internal electrodes 6 have end portions which are connected to the second external electrode 4.

Subsequently, dimensions of each portion of the varistor 1C will be described. The length L (L dimension) of the varistor 1C is 570 to 630 µm, for example, and it is 600 µm in the present embodiment. The width W (W dimension) of the varistor 1C is 270 to 330 µm, for example, and it is 300 µm in the present embodiment. The height T (T dimension) of the varistor 1C is 270 to 330 µm, for example, and it is 300 µm in the present embodiment.

The overlapping length EL of the first internal electrodes 5 and the second internal electrodes 6 in the second direction D2 is 35 µm, for example. The overlapping width EW of the first internal electrodes 5 and the second internal electrodes 6 in the second direction D2 is 110 µm, for example. In the present embodiment, the width EW is equivalent to the widths of the first internal electrodes 5 and the second internal electrodes 6 in the third direction D3. In the varistor 1C, the length EL is smaller than the width EW (EL<EW). In other words, the width EW is larger than the length EL (EW>EL). The overlapping area of the first internal electrodes 5 and the second internal electrodes 6 is regulated by the length EL and the width EW.

The distance LG between the ends of the first internal electrodes 5 on the end surface 2b side and the end surface 2b is 260 µm, for example. The distance LG between the ends of the second internal electrodes 6 on the end surface 2a side and the end surface 2a is 260 µm, for example. The distance WG between the ends of the first internal electrodes 5 and the second internal electrodes 6 on the side surface 2e side and the side surface 2e is 80 μm, for example. The distance WG between the ends of the first internal electrodes 5 and the second internal electrodes 6 on the side surface 2f side and the side surface 2f is 80 μm, for example.

The distance LD (interlayer distance) between the first internal electrodes 5 and the second internal electrodes 6 in the second direction D2 is 45 μm, for example. The distance LT between the first internal electrode 5 disposed at a position closest to the main surface 2c and the main surface 2c in the second direction D2 is 65 μm, for example. The distance LT between the second internal electrode 6 disposed at a position closest to the main surface 2d and the main surface 2d in the second direction D2 is 65 μm, for example. In the varistor 1C, the distance LD is shorter than the distance LT (LD<LT). In other words, the distance LT is longer than the distance LD (LT>LD). In the varistor 1C, the distance LT is shorter than the distance WG (LT<WG). In other words, the distance WG is longer than the distance LT (WG>LT). The thicknesses of the first internal electrodes 5 and the second internal electrodes 6 are 1 to 2 μm, for example.

Figure 14:
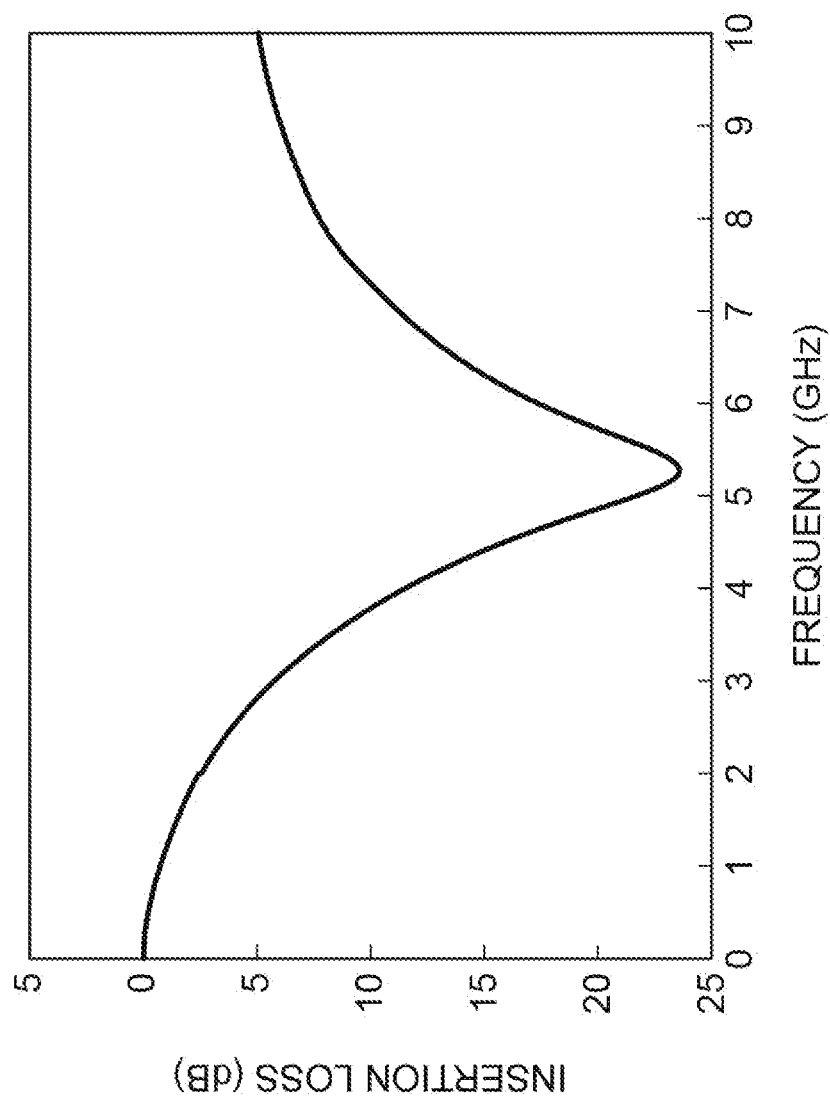
FIG. 14 is a graph showing a relationship between a frequency and an insertion loss in the notch filter including the varistor illustrated in FIGS. 12 and 13.

FIG. 14 is a graph showing a relationship between a frequency and an insertion loss in the notch filter 100 including the varistor 1C illustrated in FIGS. 12 and 13. In FIG. 14, the horizontal axis indicates a frequency [GHz], and the vertical axis indicates an insertion loss [dB]. As illustrated in FIG. 14, in the notch filter 100 including the varistor 1C having a resonance point of 5.3 GHz, a noise signal of 5.3 GHz can be attenuated. In the example illustrated in FIG. 14, in the notch filter 100, an insertion loss in a noise signal can be set to 20 dB or greater. In the notch filter 100, in a band within a predetermined range including 5.3 GHz, an insertion loss can be set to 10 dB or greater.

As described above, even in the notch filter 100 including the varistor 1C according to the present embodiment, a simplified constitution can be achieved.

Hereinabove, the embodiments of the present disclosure have been described. However, the present disclosure is not necessarily limited to the embodiments described above, and various changes can be made within a range not departing from the gist thereof.

In the foregoing embodiments, forms in which the resonance frequencies of the varistors 1, 1A, and 1B are 2.4 GHz and the resonance frequency of the varistor 1C is 5.3 GHz have been described as examples. That is, forms in which a signal of 2.4 GHz flowing in the signal line SL is attenuated in the varistors 1, 1A, and 1B and a signal of 5.3 GHz flowing in the signal line SL is attenuated in the varistor 1C have been described as examples. However, the resonance frequency of the varistor is not limited thereto. The resonance frequency of the varistor need only be set in accordance with the frequency superimposed on the signal line SL (the frequency of a signal to be attenuated). The resonance frequency of the varistor may be 1 GHz, 2.1 GHz, 2.7 GHz, or the like, for example.

In the foregoing embodiments, forms in which each of the first external electrode 3 and the second external electrode 4 is formed on five surfaces of one end surface 2a or 2b, the pair of main surfaces 2c and 2d, and the pair of side surfaces 2e and 2f have been described as examples. However, the shape of each of the first external electrode 3 and the second external electrode 4 is not limited thereto.

In addition to the foregoing embodiments, an inductor may be provided in the signal line SL. In this case, a band for noise attenuation can be set to a wide band.

In the foregoing embodiments, forms in which a protective element is the varistor 1, 1A, 1B, or 1C have been described as examples. However, a protective element may be a suppressor or the like. When a protective element is a suppressor, the protective element includes an element body, a cavity portion which is provided inside the element body, a pair of internal electrodes which are provided inside the element body, and a pair of external electrodes which are connected to the pair of internal electrodes. The pair of internal electrodes extend in the first direction. The cavity portion includes a gap region positioned between the pair of internal electrodes. In this manner, a protective element may be a so-called ESD suppressor.

Figure 15:
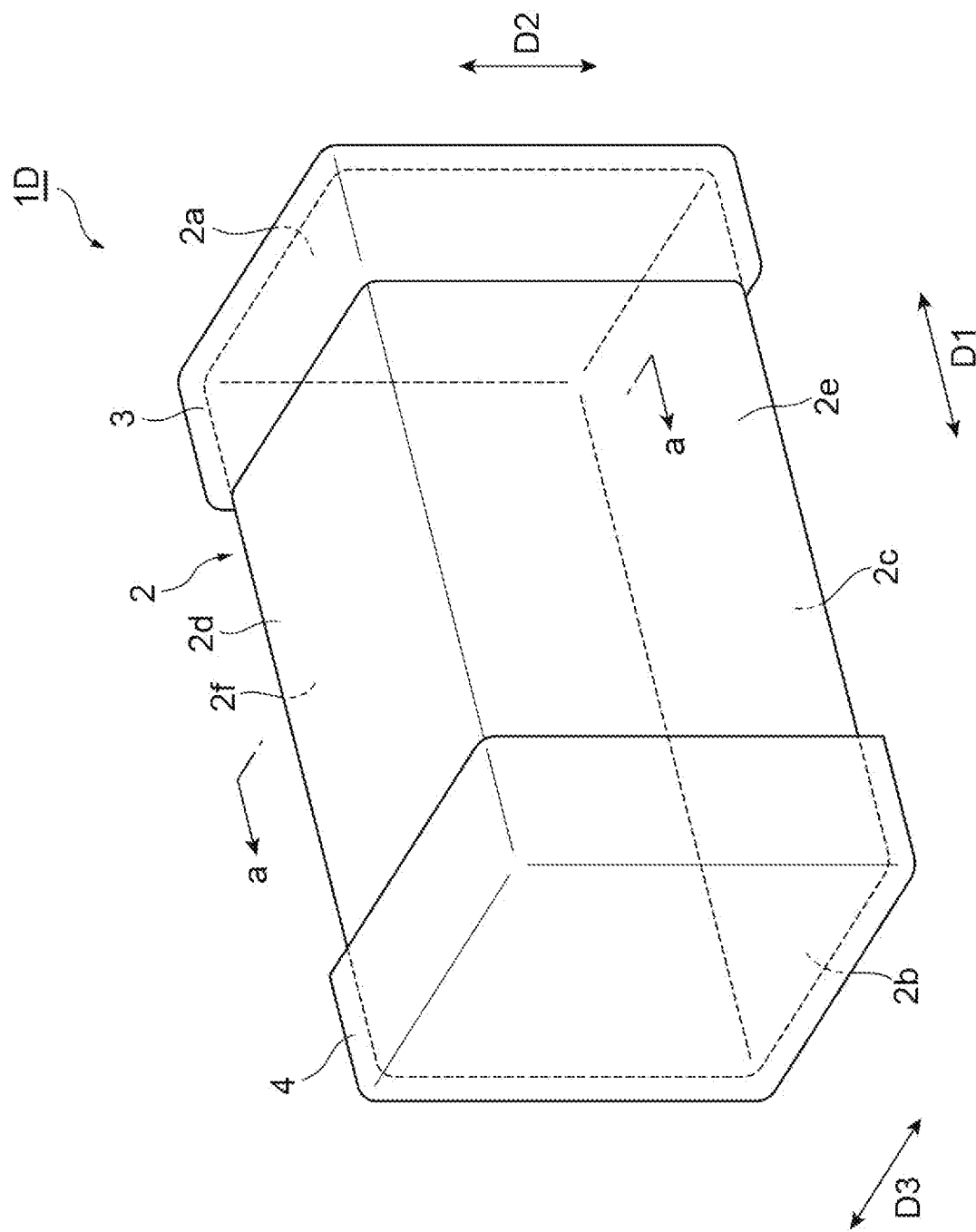
FIG. 15 is a perspective view illustrating a transient voltage protective device according to a different embodiment.

As illustrated in FIG. 15, a transient voltage protective device 1D includes the element body 2, the pair of external electrodes 3 and 4, a pair of internal electrodes 7 and 8, an auxiliary discharge portion 9, and a cavity portion S. The internal electrodes 7 and 8 are discharge electrodes which are constituted to perform discharging. The internal electrodes 7 and 8 constitute a transient voltage suppressor together with the auxiliary discharge portion 9 and the cavity portion S. The transient voltage suppressor has a transient voltage absorption performance.

The length of the element body 2 (the length of the element body 2 in the first direction D1) is 0.6 mm to 2.0 mm, for example. The width of the element body 2 (the length of the element body 2 in the second direction D2) is 0.3 mm to 1.2 mm, for example. The height of the element body 2 (the length of the element body 2 in the third direction D3) is 0.3 mm to 1.2 mm, for example.

Figure 16:
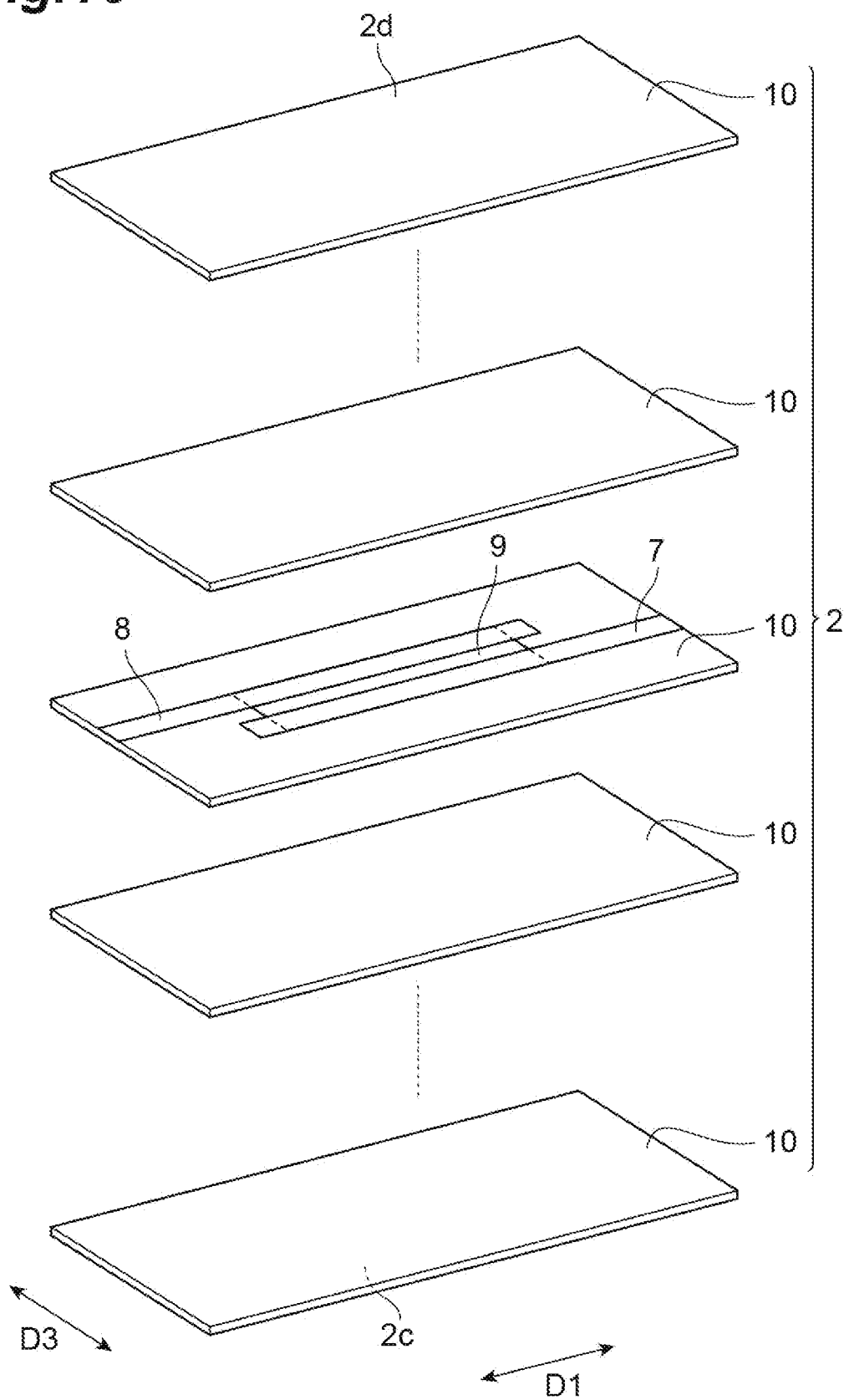
FIG. 16 is a development perspective view of the transient voltage protective device in FIG. 15.

As illustrated in FIG. 16, the element body 2 has a plurality of insulator layers 10 which are laminated in the second direction D2. The element body 2 is constituted of a plurality of laminated insulator layers 10. Each of the insulator layers 10 exhibits a rectangular plate shape. Each of the insulator layers 10 is an insulator having electrical insulation properties and is constituted of a sintered body of an insulator green sheet. In an actual element body 2, the insulator layers 10 are integrated to the extent that boundaries therebetween cannot be visually recognized.

The insulator layers 10 are constituted using a ceramic material such as $Fe_2O_3$, NiO, CuO, ZnO, MgO, $SiO_2$, $TiO_2$, $MnCO_3$, $SrCO_3$, $CaCO_3$, $BaCO_3$, $Al_2O_3$, $ZrO_2$, or $B_2O_3$. The insulator layers 10 may be constituted using a single ceramic material or may be constituted by mixing two or more kinds or ceramic materials. The insulator layers 10 may contain glass. The insulator layers 10 may contain copper oxide (CuO, $Cu_2O$) to allow low-temperature sintering.

Figure 17:
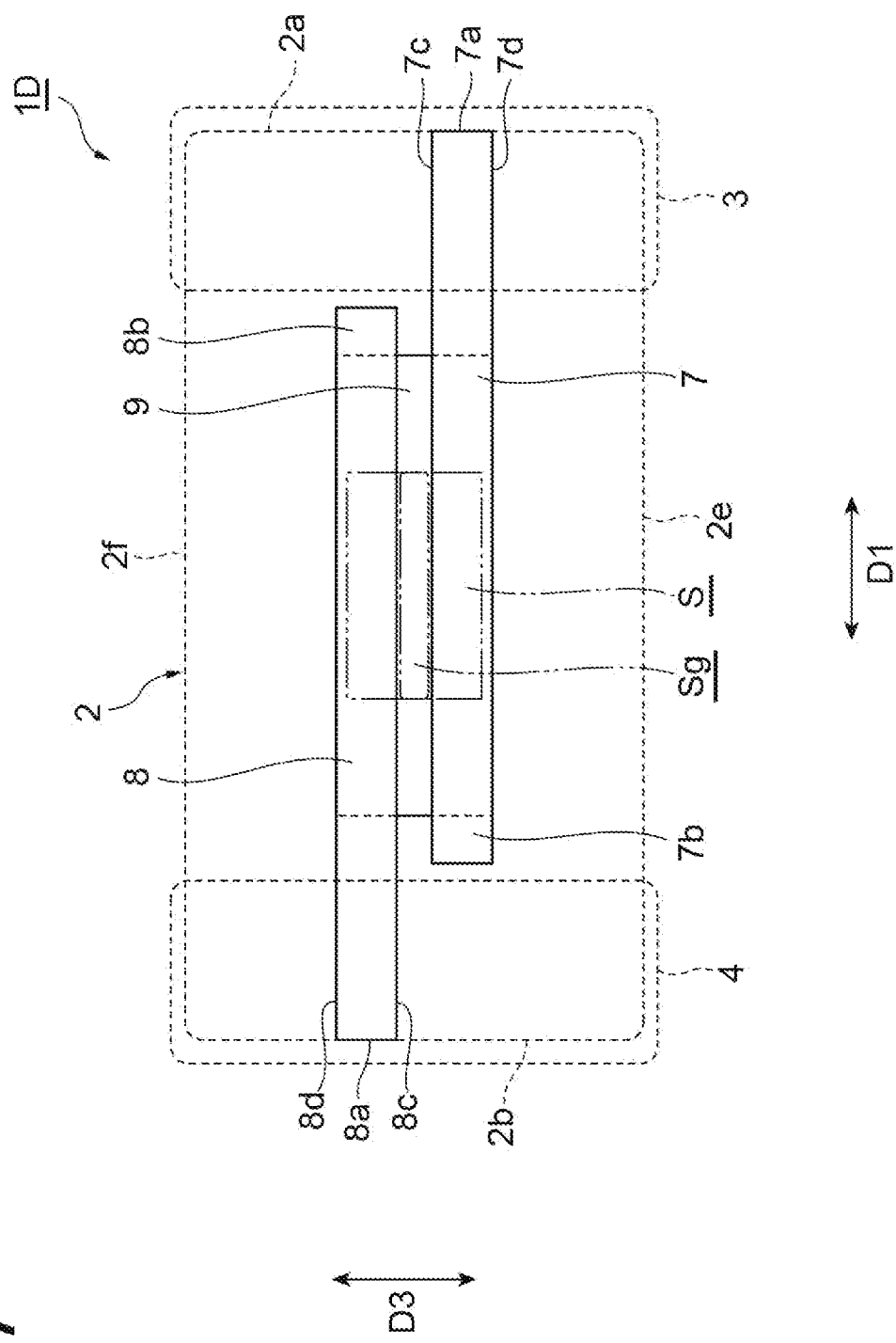
FIG. 17 is a perspective view of the transient voltage protective device in FIG. 15 viewed in a lamination direction.
Figure 18:
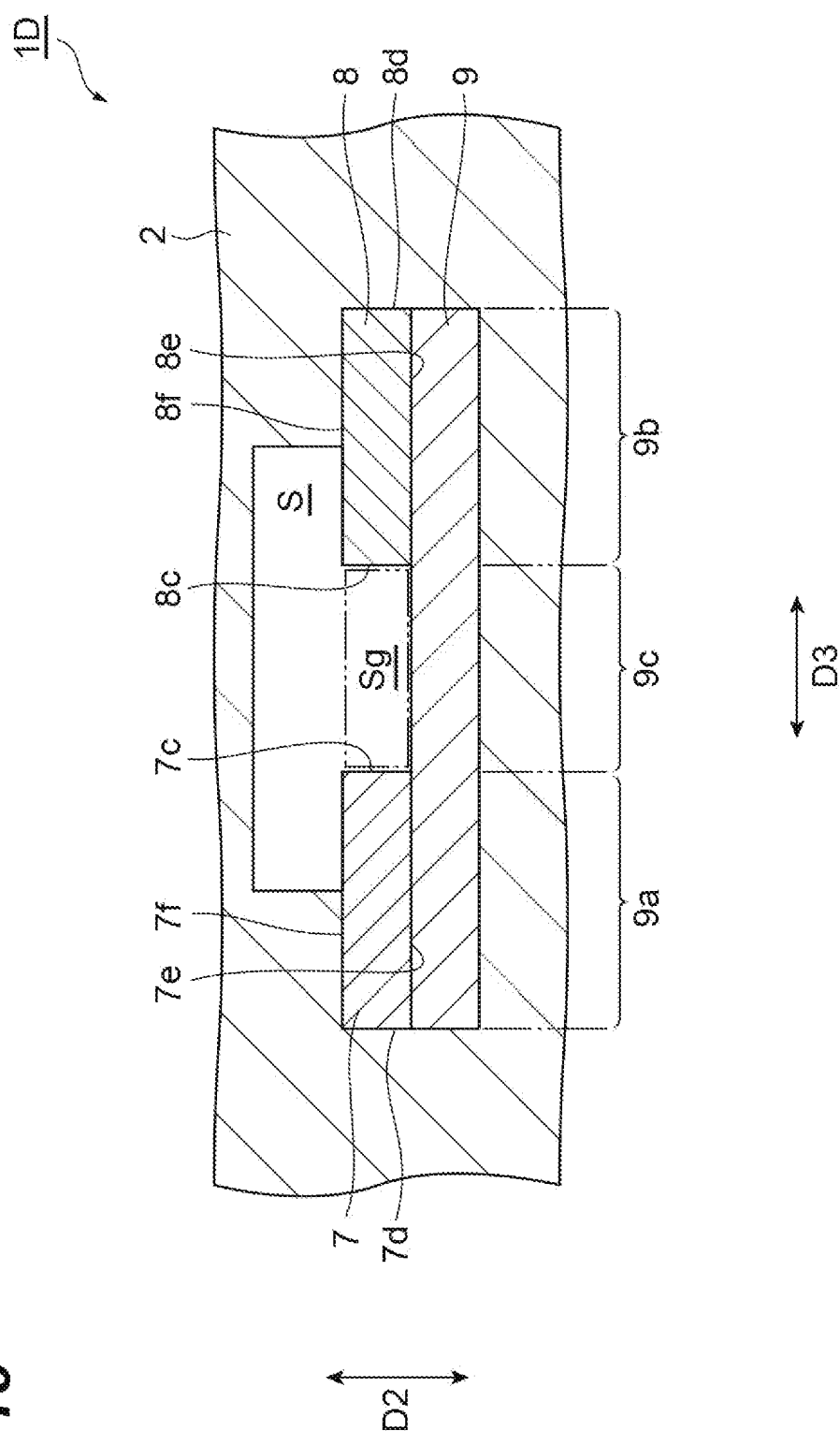
FIG. 18 is a cross-sectional view along line a-a in FIG. 15.

As illustrated in FIG. 17 or 18, the internal electrodes 7 and 8 are provided apart from each other inside the element body 2. The internal electrodes 7 and 8 extend in the first direction D1. The internal electrodes 7 and 8 are arranged with a gap therebetween in the third direction D3. The internal electrodes 7 and 8 face each other in the third direction D3 with a gap region Sg (which will be described below) therebetween. The internal electrode 7 is disposed near the side surface 2e. The internal electrode 8 is disposed near the side surface 2f. The internal electrodes 7 and 8 are disposed at the same height positions (that is, the same lamination positions) in the second direction D2. The internal electrodes 7 and 8 are disposed on the same insulator layer 10. The internal electrodes 7 and 8 are provided substantially at the center in a lamination direction (second direction D2).

The internal electrodes 7 and 8 exhibit rectangular shapes having the first direction D1 as a longitudinal direction in a plan view (that is, when viewed in the second direction D2).

For example, the internal electrodes 7 and 8 exhibit the same shapes. The lengths of the internal electrodes 7 and 8 (the lengths of the internal electrodes 7 and 8 in the first direction D1) are 0.5 mm to 1.6 mm, for example. The widths of the internal electrodes 7 and 8 (the lengths of the internal electrodes 7 and 8 in the third direction D3) are 0.1 mm to 0.5 mm for example. The thicknesses of the internal electrodes 7 and 8 (the lengths of the internal electrodes 7 and 8 in the second direction D2) are 3 μm to 20 μm, for example.

The internal electrode 7 has a connection end (connection end surface) 7a which is connected to an external electrode 3, and a tip portion 7b which is positioned on a side opposite to the external electrode 3. The connection end 7a is exposed on the end surface 2a. The tip portion 7b is apart from the end surface 2b. The tip portion 7b is a part having a predetermined length in an extending direction of the internal electrode 7 (first direction D1). The tip portion 7b includes not only a tip (tip surface) of the internal electrode 7 but also apart adjacent to the tip. The tip portion 7b is embedded into the element body 2 and comes into contact with only the element body 2. The tip portion 7b is covered by the element body 2 so as not to be exposed from the element body 2. The tip portion 7b comes into contact with the element body 2 not only in the first direction D1 but also in a direction intersecting the first direction D1. When viewed in the second direction D2, the tip portion 7b is apart from the external electrode 4 and does not overlap the external electrode 4.

The internal electrode 7 has a side edge (side surface) 7c facing the internal electrode 8, a side edge (side surface) 7d facing the side edge 7c, a first surface 7e in contact with the auxiliary discharge portion 9, and a second surface 7f facing the first surface 7e. The side edge 7c has a part facing the gap region Sg (which will be described below). The second surface 7f has a part facing a region other than the gap region Sg in the cavity portion S. The side edge 7c is adjacent to each of the first surface 7e and the second surface 7f. The internal electrode 7 is provided apart from the end surface 2b, the main surfaces 2c and 2d, and the side surfaces 2e and 2f.

The internal electrode 8 has a connection end (connection end surface) 8a which is connected to the external electrode 4, and a tip portion 8b which is positioned on a side opposite to the external electrode 4. The connection end 8a is exposed on the end surface 2b. The tip portion 8b is apart from the end surface 2a. The tip portion 8b is a part having a predetermined length in an extending direction of the internal electrode 8 (first direction D1). The tip portion 8b includes not only a tip (tip surface) of the internal electrode 8 but also a part adjacent to the tip. The tip portion 8b is embedded into the element body 2 and comes into contact with only the element body 2. The tip portion 8b is covered by the element body 2 so as not to be exposed from the element body 2. The tip portion 8b comes into contact with the element body 2 not only in the first direction D1 but also in a direction intersecting the first direction D1. When viewed in the second direction D2, the tip portion 8b is apart from the external electrode 3 and does not overlap the external electrode 3.

The internal electrode 8 has a side edge (side surface) 8c facing the side edge 7c of the internal electrode 7, a side edge (side surface) 8d facing the side edge 8c, a first surface 8e in contact with the auxiliary discharge portion 9, and a second surface 8f facing the first surface 8e.

The side edge 8c has a part facing the gap region Sg (which will be described below). The second surface 8f has a part facing a region other than the gap region Sg in the cavity portion S. The side edge 8c is adjacent to each of the first surface 8e and the second surface 8f. The internal electrode 8 is provided apart from the end surface 2a, the main surfaces 2c and 2d, and the side surfaces 2e and 2f. The internal electrodes 7 and 8 are constituted using a conductor material containing Ag, Pd, Au, Pt, Cu, Ni, Al, Mo, or W, for example.

The internal electrodes 7 and 8 may be constituted using a Ag/Pd alloy, a Ag/Cu alloy, a Ag/Au alloy, or a Ag/Pt alloy, for example.

The auxiliary discharge portion 9 is provided inside the element body 2. The auxiliary discharge portion 9 exhibits a rectangular shape having the first direction D1 as a longitudinal direction in a plan view (that is, when viewed in the second direction D2). The length of the auxiliary discharge portion 9 (the length of the auxiliary discharge portion 9 in the first direction D1) is 0.4 mm to 1.5 mm, for example. The width of the auxiliary discharge portion 9 (the length of the auxiliary discharge portion 9 in the third direction D3) is 0.15 mm to 0.95 mm, for example. The thickness of the auxiliary discharge portion (the length of the auxiliary discharge portion in the second direction D2) is 3 μm to 20 μm, for example.

The auxiliary discharge portion 9 is provided apart from the outer surface of the element body 2 so as not to be exposed from the element body 2. The auxiliary discharge portion 9 is in contact with the internal electrodes 7 and 8 and connects the internal electrodes 7 and 8 to each other. One end of the auxiliary discharge portion 9 in the third direction D3 coincides with one end of the internal electrode 7 in the third direction D3. The other end of the auxiliary discharge portion 9 in the third direction D3 coincides with the other end of the internal electrode 7 in the third direction D3. The auxiliary discharge portion 9 is exposed from the internal electrodes 7 and 8 and faces the gap region Sg.

The auxiliary discharge portion 9 includes a first part 9a, a second part 9b, and a third part 9c. The first part 9a is covered by the internal electrode 7 and is in contact with the first surface 7e. The second part 9b is covered by the internal electrode 8 and is in contact with the first surface 8e. The third part 9c extends in the third direction D3 and connects the first part 9a and the second part 9b to each other. The third part 9c has a region which is exposed from the internal electrodes 7 and 8 and faces the gap region Sg.

The auxiliary discharge portion 9 includes an insulator and metal particles. For example, the insulator is constituted using a ceramic material. Examples of a ceramic material include $Fe_2O_3$, $NiO$, $CuO$, $ZnO$, $MgO$, $SiO_2$, $TiO_2$, $MnCO_3$, $SrCO_3$, $CaCO_3$, $BaCO_3$, $Al_2O_3$, $ZrO_2$, and $B_2O_3$. The auxiliary discharge portion 9 may include only one kind of these ceramic materials or may include two or more kinds of these ceramic materials which are mixed. For example, metal particles are constituted using Ag, Pd, Au, Pt, a Ag/Pd alloy, a Ag/Cu alloy, a Ag/Au alloy, or a Ag/Pt alloy. The auxiliary discharge portion 9 may include semiconductor particles such as $RuO_2$. The auxiliary discharge portion 9 may include glass.

For example, the auxiliary discharge portion 9 is formed by applying a slurry including the foregoing ceramic materials, metal particles, and the like onto an insulator green sheet by printing, and then baking the slurry together with the insulator green sheet.

The cavity portion S is provided inside the element body 2. The cavity portion S includes the gap region Sg positioned between the internal electrodes 7 and 8 in the third direction D3. The width of gap region Sg (the length of the gap region Sg in the third direction D3), that is, the gap between the internal electrodes 7 and 8 is 10 μm to 70 μm, for example. The cavity portion S is provided apart from the outer surface of the element body 2. A surface defining the cavity portion S includes the side edge 7c and the second surface 7f of the internal electrode 7, the side edge 8c and the second surface 8f of the internal electrode 8, and a surface in the third part 9c of the auxiliary discharge portion 9 exposed from the internal electrodes 7 and 8.

When viewed in the second direction D2, the cavity portion S is positioned on the inward side of an outer edge of the auxiliary discharge portion 9. The auxiliary discharge portion 9 is longer than the cavity portion S in each of the first direction D1 and the third direction D3. For example, the cavity portion S is formed by applying an organic lacquer including an organic solvent and an organic binder onto an insulator green sheet by printing, and then baking the organic lacquer together with the insulator green sheet such that the organic lacquer is burned.

Even in the notch filter 100 including the transient voltage protective device 1D, a simplified constitution can be achieved.

What is claimed is:

1. A notch filter comprising:
a protective element connected between a signal line and a ground,
wherein the protective element has a capacitive component and outputs a signal with a second frequency different from a signal with a first frequency flowing in the signal line and a signal with the second frequency superimposed on the signal line to the ground,
wherein a resonance frequency of the protective element is 2.4 GHz or 5.3 GHz.

2. The notch filter according to claim 1,
wherein an insertion loss in a signal with the second frequency is 10 dB or greater.

3. The notch filter according to claim 1,
wherein a resonance frequency of the protective element and the second frequency are equivalent to each other.

4. The notch filter according to claim 1,
wherein an electrostatic capacitance of the capacitive component of the protective element is 20 pF or smaller.

5. A notch filter comprising:
a protective element connected between a signal line and a ground,
wherein the protective element has a capacitive component and outputs a signal with a second frequency different from a signal with a first frequency flowing in the signal line and a signal with the second frequency superimposed on the signal line to the ground,
wherein the protective element includes
an element body having a pair of end surfaces facing each other in a first direction, a pair of main surfaces facing each other in a second direction, and a pair of side surfaces facing each other in a third direction,
a first internal electrode and a second internal electrode disposed inside the element body and disposed in a manner of partially overlapping each other in the second direction, and
a first external electrode having the first internal electrode connected thereto and disposed on a side of one of the end surfaces, and a second external electrode having the second internal electrode connected thereto and disposed on a side of the other of the end surfaces, and
wherein a distance between one of the end surfaces and an end of the second internal electrode on the side of one of the end surfaces in the first direction and a distance between the other of the end surfaces and an end of the first internal electrode on the side of the other of the end surfaces in the first direction are longer than a distance between one of the side surfaces and an end of each of the first internal electrode and the second internal electrode on a side of one of the side surfaces in the third direction and a distance between the other of the side surfaces and an end of each of the first internal electrode and the second internal electrode on a side of the other of the side surfaces in the third direction.

6. The notch filter according to claim 5,
wherein a distance between the first internal electrode or the second internal electrode disposed closest to one of the main surfaces and one of the main surfaces in the third direction and a distance between the first internal electrode or the second internal electrode disposed closest to the other of the main surfaces in the third direction are equal to or shorter than a distance between one of the side surfaces and an end of each of the first internal electrode and the second internal electrode on a side of one of the side surfaces in the third direction and a distance between the other of the side surfaces and an end of each of the first internal electrode and the second internal electrode on a side of the other of the side surfaces in the third direction.

7. A notch filter comprising:
a protective element connected between a signal line and a ground,
wherein the protective element has a capacitive component and outputs a signal with a second frequency different from a signal with a first frequency flowing in the signal line and a signal with the second frequency superimposed on the signal line to the ground,
wherein the protective element includes
an element body,
a cavity portion provided inside the element body,
a pair of internal electrodes provided inside the element body, and
a pair of external electrodes connected to the pair of internal electrodes,
wherein the pair of internal electrodes extend in the first direction, and
wherein the cavity portion includes a gap region positioned between the pair of internal electrodes.

* * * * *